United States Patent
Kim et al.

(10) Patent No.: US 7,165,208 B2
(45) Date of Patent: Jan. 16, 2007

(54) APPARATUS AND METHOD FOR ENCODING AND DECODING TFCI IN A MOBILE COMMUNICATION SYSTEM

(75) Inventors: Jae-Yoel Kim, Kunpo-shi (KR); Hyun-Woo Lee, Suwon-shi (KR); Seong-Ill Park, Kunpo-shi (KR); Ho-Kyu Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/852,416

(22) Filed: May 24, 2004

(65) Prior Publication Data

US 2004/0216025 A1 Oct. 28, 2004

Related U.S. Application Data

(62) Division of application No. 09/879,688, filed on Jun. 12, 2001.

(30) Foreign Application Priority Data

Jun. 12, 2000 (KR) ............... 2000-33107

(51) Int. Cl.
*H03M 3/00* (2006.01)
*H03M 3/03* (2006.01)
(52) U.S. Cl. .............. 714/776; 714/778; 714/790
(58) Field of Classification Search .......... 714/776, 714/778, 790
See application file for complete search history.

(56) References Cited

U.S. PATENT DOCUMENTS

| 3,818,442 A | 6/1974 | Solomon |
| 5,742,622 A * | 4/1998 | Claydon et al. ............ 714/789 |
| 6,341,125 B1 | 1/2002 | Hong et al. |

FOREIGN PATENT DOCUMENTS

| EP | 1 104 130 | 5/2001 |
| EP | 1 195 934 | 4/2002 |
| WO | WO 99/33212 | 7/1999 |

OTHER PUBLICATIONS

"Coding of Transport Format Combination Indicator (TFCI)", TSG-RAN Working Group 1, Meeting #13, May 22-25, 2000, TSGR1(00)0670.

(Continued)

*Primary Examiner*—Joseph D. Torres
(74) *Attorney, Agent, or Firm*—The Farrell Law Firm

(57) ABSTRACT

Disclosed is an apparatus for encoding k consecutive inputs indicating a TFCI (Transport Format Combination Indicator) of each of successively transmitted frames into a sequence of m symbols in an NB-TDD (Narrowband-Time Division Duplex) mobile communication system. An encoder encodes the k input bits into a sequence of at least $2^n$ symbols where $2^n > m$, using an extended Reed-Muller code from a Kasami sequence. A puncturer performs puncturing on the sequence of $2^n$ symbols from the encoder so as to output a sequence of m symbols.

12 Claims, 12 Drawing Sheets

OTHER PUBLICATIONS

"Transmission of TFCI", TSG-RAN Working Group 1, Meeting #13, May 22-25, 2000, TSGR1(00)0671.

"3rd Generation Partnership Project (3GPP); Technical Specification Group (TSG): Radio Access Network (RAN); 1.28Mcps Functionality for UTRA TDD Physical Layer", 2000.

Samsung Electronics Co., Ltd.: "Text Proposal Regarding TFC1 Coding for FDD", TSG-RAN Working Group 1, Meeting #7, Aug. 30-Sep. 3, 1999, TSGR1#7(99)D69.

Samsung: "Text Proposal Regarding TFC1 Coding for FDD", TSG-RAN Working Group 1, Meeting #7, Aug. 30-Sep. 3, 1999, TSGR1#7(99)b62.

Samsung: "New Optimal Coding for Extended TFC1 with Almost No Complexity Increase", TSG-RAN Working Group 1, Meeting #7, Aug. 30-Sep. 3, 1999, TSGR1#7(99)99b60.

Samsung: "Harmonization Impact on TFC1 and New Optimal Coding for Extended TFC1 with Almost No Complexity Increase", TSG-RAN Working Group 1, Meeting #6, Jul. 13-16, 1999, TSGR#6(99)970.

Samsung: "Harmonization Impact on TFC1 and New Optimal Coding for Extended TFC1 with Almost No Complexity Increase", TSG-RAN Working Group 1, Meeting #5, Jul. 13-16, 1999, TSGR(99)913.

Samsung Electronics Co., Ltd.: "Text Proposal Regarding TFC1 Coding for TDD", TSG-RAN Working Group 1, Meeting #7, Aug. 30-Sep. 3, 1999, TSGR1#(99)D70.

Samsung: "Text Proposal Regarding TFC1 Coding for TDD", TSG-RAN Working Group 1, Meeting #7, Aug. 30-Sep. 3, 1999, TSGR1#7(99)b61.

"ETS1 TS 125 212 Universal Mobile Telecommunications System (UMTS); Multiplexing and Channel Coding (FDD)"; Jan. 2000.

Nikula et al., "Frames Multiple Access for UMTS and IMT-2000", IEEE Personal Communications, IEEE Communications Society, US, vol. 5, No. 2, Apr. 1, 1998.

"An Updated Table of Minimum-Distance Bounds For Binary Linear Codes", A.E. Brouwer and Tom Verhoeff, IEEE Transactions on Information Theory, vol. 39, No. 2, Mar. 1993, pp. 662-677.

* cited by examiner

US 7,165,208 B2

APPARATUS AND METHOD FOR ENCODING AND DECODING TFCI IN A MOBILE COMMUNICATION SYSTEM

PRIORITY

This application is a divisional of application Ser. No. 09/879,688, filed Jun. 12, 2001, and this application claims priority to an application entitled "Apparatus and Method for Encoding and Decoding TFCI in a Mobile Communication System" filed in the Korean Industrial Property Office on Jun. 12, 2000 and assigned Ser. No. 2000-33107, the contents of each of which are incorporated herein by reference.

BACKGROUND OF THE INVENTION

1. Field of the Invention

The present invention relates generally to an apparatus and method for a TFCI (Transport Format Combination Indicator) code generator in a CDMA mobile communication system, and in particular, to an apparatus and method for encoding a TFCI in an NB-TDD (Narrowband-Time Division Duplex) mobile communication system.

2. Description of the Related Art

In general, a CDMA mobile communication system (or an IMT-2000 system) transmits data frames of various services such as a voice service, an image service and a data service all together, using a single physical channel. Such service frames are transmitted at either a fixed data rate or a variable data rate. As for the different services transmitted at a fixed data rate, it is not necessary to inform a receiver of a spreading rate of the respective service frames. However, regarding the services transmitted at a variable data rate, it is necessary to inform the receiver of a spreading rate of the respective service frames. In the IMT-2000 system, the data rate is in inverse proportion to the data spreading rate.

When the respective services use different frame transfer rates, a TFCI is used to indicate a combination of the currently transmitted services. The TFCI secures correct reception of the respective services.

FIG. 1 illustrates an example in which an NB-TDD communication system uses the TFCI. Herein, the NB-TDD system employs 8PSK (8-ary Phase Shift Keying) modulation for high-speed transmission, and the TFCI bits are encoded to a code of length 48 before transmission. As shown in FIG. 1, one frame is divided into two sub-frames of a sub-frame#1 and a sub-frame#2. Each sub-frame is comprised of 7 time slots TS#0–TS#6. Among the 7 time slots, the odd-numbered time slots TS#0, TS#2, TS#4 and TS#6 are used for an uplink transmitted from a mobile station to a base station, while the even-numbered time slots TS#1, TS#3 and TS#5 are used for a downlink transmitted from a base station to a mobile station. Each time slot has a structure in which data symbols, a first part of TFCI, a midamble signal, SS symbols, TPC symbols, a second part of TFCI, data symbols and GP are sequentially time-multiplexed.

FIG. 2 illustrates a structure of a transmitter for transmitting a frame in a conventional NB-TDD communication system. Referring to FIG. 2, a TFCI encoder 200 encodes an input TFCI and outputs a TFCI symbols. A first multiplexer (MUX) 210 multiplexes the TFCI symbols output from the TFCI encoder 200 and other signals. Here, the "other signals" refer to the data symbol, the SS symbol and the TCP symbol included in each slot of FIG. 1. That is, the first multiplexer 210 multiplexes the TFCI symbol and the other signals except for the midamble signal of FIG. 1. A channel spreader 220 channel-spreads the output of the first multiplexer 210 by multiplying it by a given orthogonal code. A scrambler 230 scrambles the output of the channel spreader 220 by multiplying it by a scrambling code. A second multiplexer 240 multiplexes the output of the scrambler 230 and the midamble signal as shown in FIG. 1. Here, the first multiplexer 210 and the second multiplexer 240 generate the frame structure of FIG. 1, under the control of a controller (not shown).

FIG. 3 illustrates a structure of a receiver in the conventional NB-TDD communication system. Referring to FIG. 3, a first demultiplexer 340 demultiplexes an input frame signal under the control of a controller (not shown), and outputs a midamble signal and other signals. Here, the "other signals" include the TFCI symbol, the data symbol, the SS symbol and the TCP symbol. A descrambler 330 descrambles the other signals output from the demultiplexer 340 by multiplying them by a scrambling code. A channel despreader 320 channel-despreads the output of the descrambler 330 by multiplying it by an orthogonal code. A second demultiplexer 310 demultiplexes the signals output from the channel despreader 320 into the TFCI symbol and other signals, under the control of the controller. Here, the "other signals" include the data symbol, the SS symbol, and the TCP symbol. A TFCI decoder 300 decodes the TFCI symbol output from the second demultiplexer 310 and outputs TFCI bits.

The TFCI is comprised of 1 to 2 bits to indicate 1 to 4 combinations of the services, comprised of 3 to 5 bits to indicate 8 to 32 combinations of the services, or comprised of 6 to 10 bits to indicate 64 to 1024 combinations of the services. Since the TFCI is information indispensable when the receiver analyzes the respective service frames, a transmission error of the TFCI may prevent the receiver from correctly analyzing the respective service frames. Therefore, the TFCI is encoded using an error correcting code so that even though a transmission error occurs on the TFCI, the receiver can correct the error.

FIG. 4 illustrates a scheme for encoding the TFCI using an error correcting code according to the prior art. Referring to FIG. 4, an extended Reed-Muller encoder 400 encodes an input 10-bit TFCI and outputs a 32-symbol TFCI codeword. A repeater 410 outputs intact even-numbered symbols of the TFCI codeword output from the extended Reed-Muller encoder 400 and repeats odd-numbered symbols, thereby outputting a total of 48 coded symbols. In FIG. 4, a less-than-10-bit TFCI is constructed to have a 10-bit format by padding a value of 0 from the MSB (Most Significant Bit), i.e., from the leftmost bit. The (32,10) extended Reed-Muller encoder 400 is disclosed in detail in Korean patent application No. 1999-27932, the contents of which are hereby incorporated by reference.

In the (32,10) extended Reed-Muller encoder 400, a minimum distance between codes is 12. After repetition, an input code is converted to a (48,10) code having a minimum distance of 16. In general, an error correction capability of binary linear codes is determined depending on the minimum distance between the binary linear codes. The minimum distance (dmin) between the binary linear codes to become optimal codes is disclosed in a paper entitled "An Updated Table of Minimum-Distance Bounds for Binary Linear Codes" (A. E. Brouwer and Tom Verhoeff, IEEE Transactions on information Theory, VOL 39, NO. 2, MARCH 1993).

The paper discloses that the minimum distance required for the binary linear codes used to obtain a 48-bit output from a 10-bit input is 19 to 20. However, since the encoder 400 has a minimum distance of 16, the error correction encoding scheme of FIG. 4 does not have optimal codes, causing an increase in TFCI error probability in the same channel environment. Because of the TFCI error, the receiver may misjudge a rate of the data frame and decode the data frame at the misjudged rate, thereby increasing a frame error rate (FER). Therefore, it is important to minimize a frame error rate of the error correction encoder for encoding the TFCI.

SUMMARY OF THE INVENTION

It is, therefore, an object of the present invention to provide a (48,10) encoding and decoding apparatus and method for encoding a TFCI.

It is another object of the present invention to provide an apparatus and method for encoding a TFCI in an NB-TDD CDMA mobile communication system.

It is further another object of the present invention to provide an apparatus and method for decoding a TFCI in an NB-TDD CDMA mobile communication system.

To achieve the above and other objects, there is provided an apparatus for encoding k consecutive inputs indicating a TFCI of each of successively transmitted frames into a sequence of m symbols in an NB-TDD mobile communication system. An encoder encodes the k input bits into a sequence of at least $2^n$ symbols where $2^n$>m, using an extended Reed-Muller code from a Kasami sequence. A puncturer performs puncturing on the sequence of $2^n$ symbols from the encoder so as to output a sequence of m symbols.

Preferably, the encoder comprises: a 1-bit generator for generating a sequence of same symbols; a basis orthogonal sequence generator for generating a plurality of basis orthogonal sequences; a basis mask sequence generator for generating a plurality of basis mask sequences; and an operator for receiving the TFCI including a first information part indicating conversion to a biorthogonal sequence, a second information part indicating conversion to an orthogonal sequence and a third information part indicating conversion to a mask sequence. The operator is also for generating the sequence of $2^n$ symbols by combining an orthogonal sequence selected from the basis orthogonal sequences by the second information part, a biorthogonal sequence constructed by a combination of the selected orthogonal sequence and the same symbols selected by the first information part, and a mask sequence selected by the third information part.

Preferably, the operator comprises a first multiplier for multiplying the same symbols by the first information part; a plurality of second multipliers for multiplying the basis orthogonal sequences by TFCI bits constituting the second information part; a plurality of third multipliers for multiplying the basis mask sequences by TFCI bits constituting the third information part; and an adder for generating the sequence of $2^n$ symbols by adding outputs of the first to third multipliers.

To achieve the above and other objects, there is provided an method for encoding 10 consecutive input bits indicating a TFCI of each of successively transmitted frames into a sequence of 48 coded symbols in an NB-TDD mobile communication system, comprising: creating first sequences having a length 48 punctured orthogonal sequences; creating second sequences having a length 48 punctured mask sequences; multiplying the first sequences with each associated TFCI bit and the second sequences with each associated TFCI bit; and adding the each resulting sequences calculated by the multiplication and outputting the sequence of 48 symbols wherein the punctured orthogonal sequences and the punctured mask sequences are sequences generated by puncturing following positions out of length 64 Walsh codes and length 64 masks; {0, 4, 8,13,16,20,27,31,34,38, 41,44,50,54,57,61}

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

A CDMA mobile communication system according an embodiment of the present invention uses extended Reed-Muller codes to create optimal codes when encoding a TFCI.

Commonly, a measure, i.e., a parameter indicating performance of a linear error correcting code, includes distribution of a Hamming distance of a codeword of an error correcting code. The Hamming distance refers to the number of non-zero symbols in the respective codewords. That is, for a codeword '0111', the number of 1's included in this codeword, i.e., the Hamming distance is 3. The least value among the Hamming distance values of several codewords is called a "minimum distance (dmin)". The linear error correcting code has superior error correcting performance (or capability), as the minimum distance is increased more and more.

The extended Reed-Muller code can be derived from a sequence determined by the sum (or XOR) of a specific sequence and an m-sequence. In order to use a sequence family (or group) including the sum of the sequences as its elements, the sequence family must have a large minimum distance. Such specific sequence family includes a Kasami sequence family, a Gold sequence family and a Kerdock code family. Such specific sequences have a minimum distance of $(2^{2m}-2^m)/2$ for the full length $L=2^{2m}$, and a minimum distance of $2^{2m}-2^m$ for the full distance $L=2^{2m+1}$. That is, the minimum distance is 28 for the full length 64.

Now, a description will be made regarding a method for creating an extended error correcting code which is a linear error correcting code having high performance, using the above stated sequence families.

Figure 1:
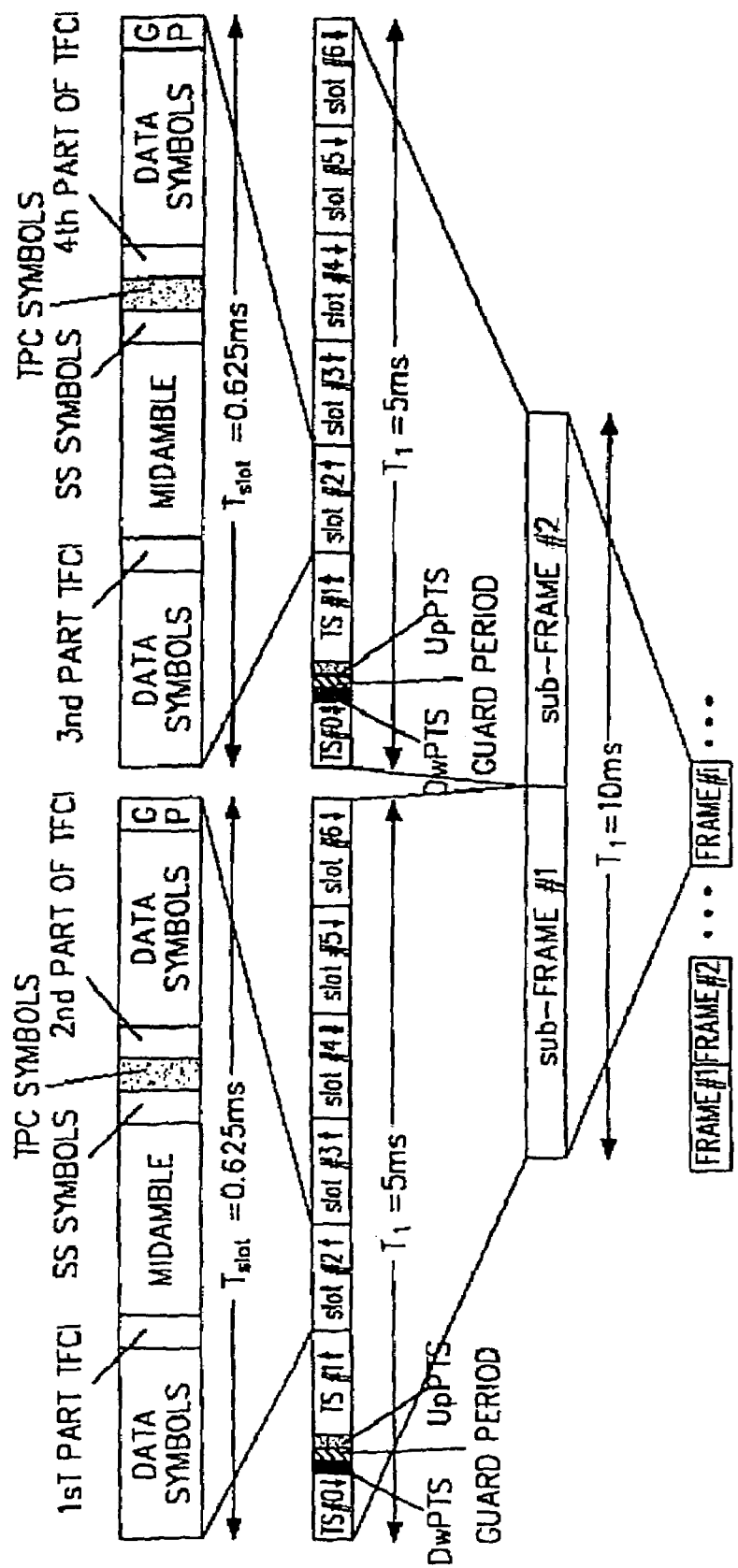
FIG. 1 is a diagram illustrating a frame format used in a conventional NB-TDD CDMA communication system.
Figure 2:
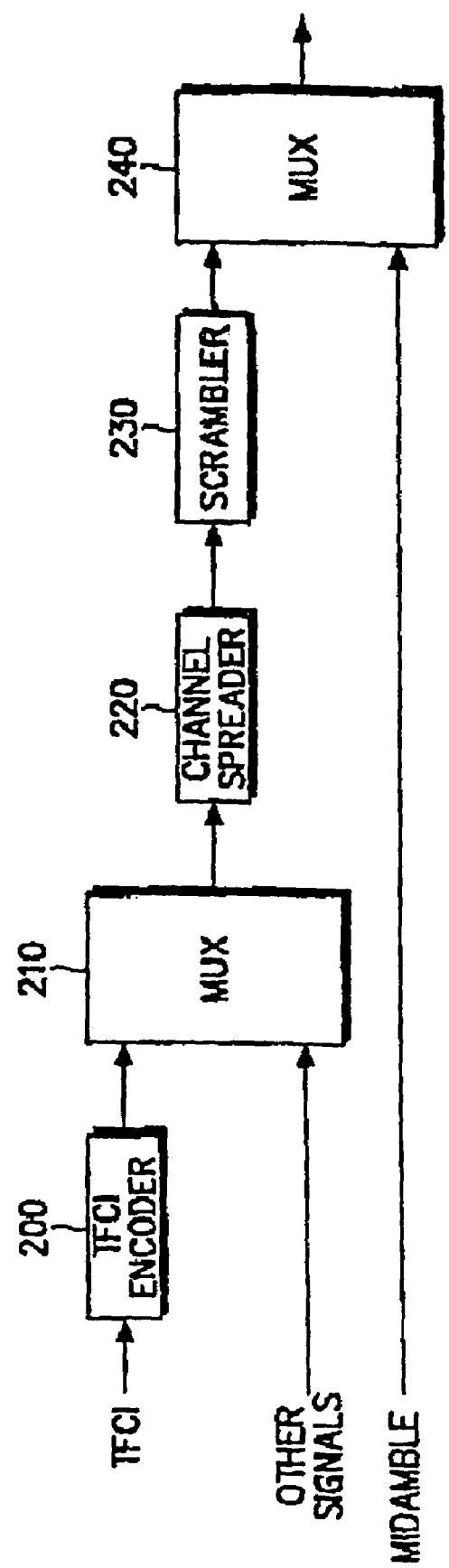
FIG. 2 is a diagram illustrating a structure of a transmitter for transmitting a frame in the conventional NB-TDD communication system.
Figure 3:
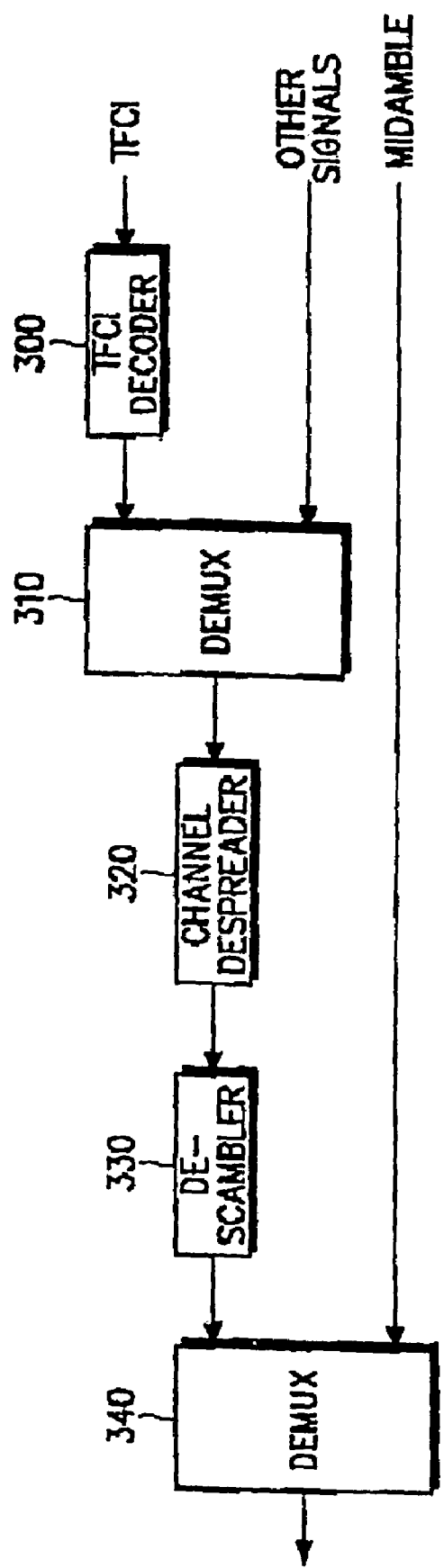
FIG. 3 is a diagram illustrating a structure of a receiver for the conventional NB-TDD communication system.
Figure 4:
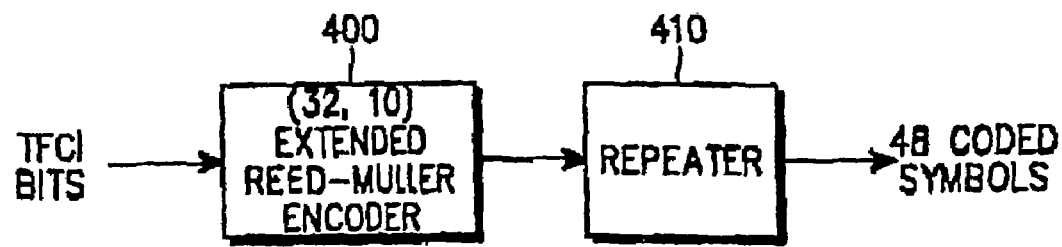
FIG. 4 is a diagram illustrating a scheme for encoding a TFCI using an error correcting code according to the prior art.
Figure 5:
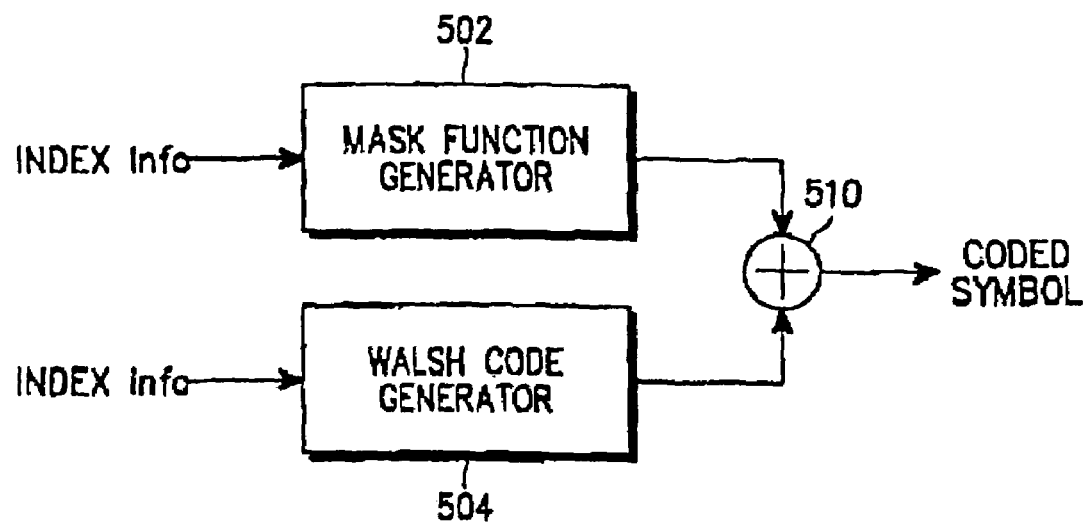
FIG. 5 is a diagram illustrating a scheme for encoding a linear error correcting code.

According to a coding theory, there exists a column permutation function for creating a Walsh code by cyclic-shifting the m-sequence. The m-sequence becomes a Walsh code when the sequences comprised of the specific sequence and the m-sequence are subjected to column permutation using the column permutation function. The minimum distance by the sum (XOR) of the specific sequence and the Walsh code satisfies the optimal code property. Herein, a sequence obtained by column-permuting the specific sequence will be referred to as a "mask function (or mask sequence)." FIG. 5 illustrates a scheme for encoding the linear error correcting code. As illustrated, the present invention provides a TFCI encoding scheme for making a complete coded symbol (or TFCI codeword) by adding a first coded symbol (or mask function) created by a first TFCI bit and a second coded symbol (or orthogonal code) created by a second TFCI bit.

Referring to FIG. 5, TFCI bits to be transmitted are divided into a first TFCI bit and a second TFCI bit and then, provided to a mask function generator 502 and a Walsh code generator 504, respectively. The mask function generator 504 outputs a given mask sequence by encoding the first TFCI bit, and the Walsh code generator 504 outputs a given orthogonal sequence by encoding the second TFCI bit. An adder 510 then adds (XORs) the mask sequence from the mask function generator 502 and the orthogonal sequence from the orthogonal code generator 504, and outputs a complete TFCI codeword (or TFCI coded symbol). The mask function generator 502 may have mask sequences associated with every set of the first TFCI bits in the form of a coding table. The orthogonal code generator 504 may also have orthogonal sequences associated with every set of the second TFCI bits in the form of a coding table.

Now, a description will be made of a method for creating the mask functions (or mask sequences) in the case where a $(2^n,n+k)$ code is created using the Kasami sequence. Here, the "$(2^n,n+k)$ code" refers to a code for outputting a TFCI codeword (or coded symbol) comprised of $2^n$ symbols by receiving (n+k) TFCI bits (input information bits). Actually, it is known that the Kasami sequence is represented by the sum of different m-sequences. Therefore, in order to create the $(2^n,n+k)$ code, a Kasami sequence of length $2^n-1$ must be created first. The Kasami sequence is equivalent to the sum of an m-sequence created by a generator polynomial fl(x) and a sequence obtained by repeating $2^{(n/2)}+1$ times a sequence of length $2^{(n/2)}-1$ determined by decimating the m-sequence in a unit of $2^{(n/2)}+1$. In addition, if the generator polynomial is determined, the respective m-sequences m(t), i.e., $m_1(t)$ and $m_2(t)$ can be calculated using a trace function in accordance with Equation (1) below.

$$m_1(t) = Tr(A\alpha^t), t = 0, 1, \ldots, 30 \qquad \text{Equation (1)}$$

$$\text{where,} \quad Tr(\alpha) = \sum_{k=0}^{n-1} \alpha^{2^k}, \alpha \in GF(2^n)$$

In Equation (1), A indicates a value determined according to an initial value of the m-sequence, α indicates a root of the generator polynomial, and n indicates the degree of the generator polynomial.

Figure 6:
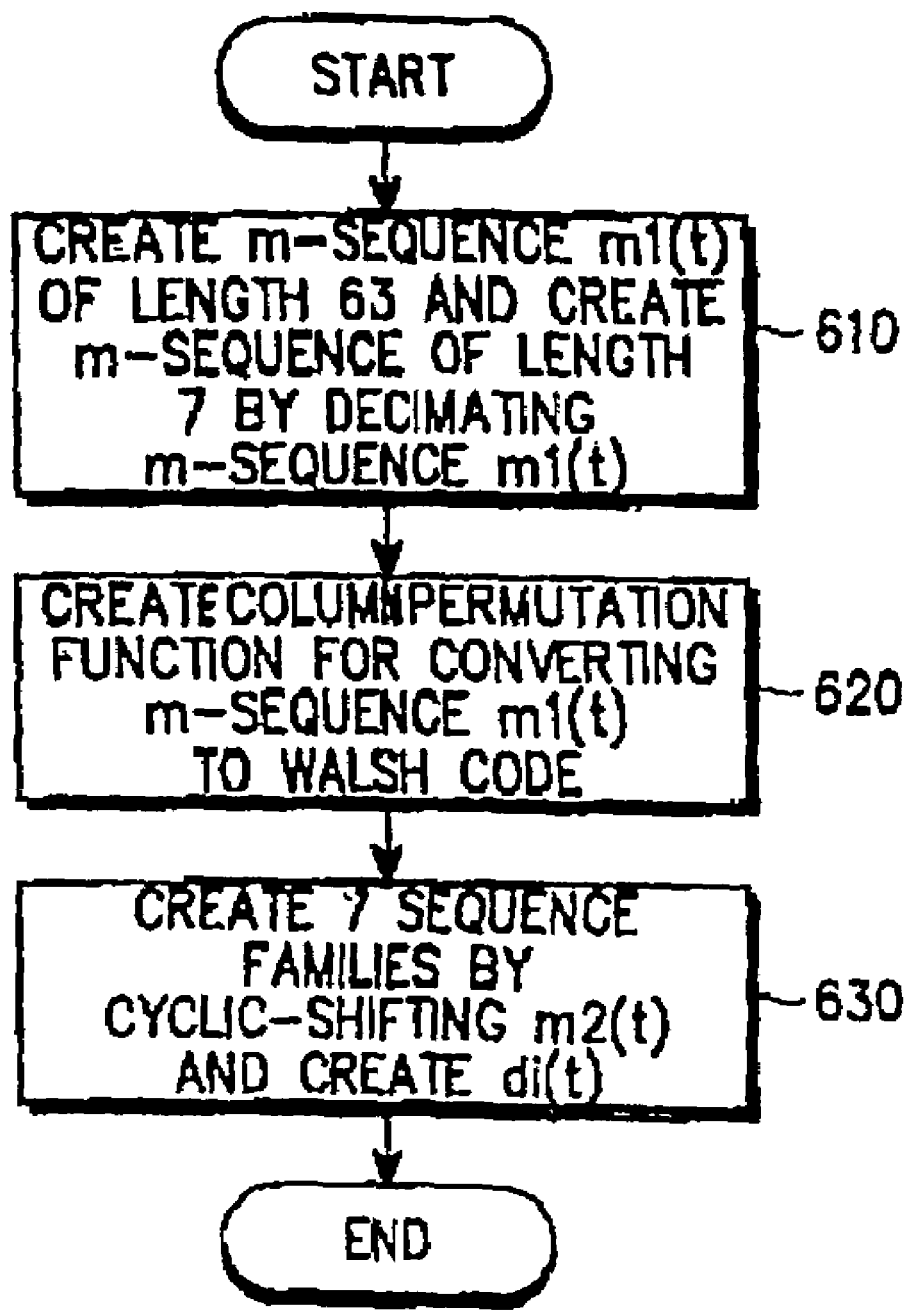
FIG. 6 is a flow chart illustrating a procedure for creating a mask function using a Kasami sequence family.

FIG. 6 illustrates a procedure for creating the mask function in the case where the $(2^n,n+k)$ code (i.e., a code for outputting a $2^n$-bit coded symbol by receiving (n+k) input information bits) is created using the Kasami sequence among the above-mentioned sequences. It is known that the Kasami sequence is represented by the sum of the different m-sequences. Therefore, in order to create the $(2^n,n+k)$ code, a Kasami sequence of length $2^n-1$ must be created first. The Kasami sequence, as described above, is created by the sum of an m-sequence created by a generator polynomial fl(x) and a sequence obtained by repeating $2^{(n/2)}+1$ times a sequence of length $2^{(n/2)}-1$ determined by decimating the m-sequence in a unit of $2^{(n/2)}+1$.

Referring to FIG. 6, in step 610, an m-sequence $m_1(t)$ created by the generator polynomial fl(x) and a sequence $m_2(t)$ obtained by repeating $2^{(n/2)}+1$ times a sequence of length $2^{(n/2)}-1$ determined by decimating the m-sequence $m_2(t)$ in a unit of $2^{(n/2)}+1$ are calculated in accordance with Equation (1). In step 620, a column permutation function σ(t) for converting the m-sequence $m_1(t)$ into a Walsh code shown in Equation (2) below is calculated.

$$\sigma : \{0, 1, 2, \ldots, 2^n - 2\} \rightarrow \{1, 2, \ldots, 2^n - 1\} \qquad \text{Equation (2)}$$

$$\sigma(t) = \sum_{i=0}^{n-1} m_1(t) 2^{n-1-i}$$

In step 630, 7 sequence families obtained by cyclic-shifting the m-sequence $m_2(t)$ 0 to 6 times are subjected to column permutation using $\sigma^{-1}(t)+2$, where $\sigma^{-1}(t)$ is an inverse function of the column permutation function σ(t) for converting the sequence $m_1(t)$ to the Walsh code. Further, '0' is added to the head of every sequence created by the column permutation so as to make the sequences have a length $2^n$, thereby creating $2^n-1$ sequence families di(t) of length $2^n$, where i=0, ..., $2^n-1$ and t=1, ..., $2^n$. The sequence families created in step 630 can be represented by Equation (3) below.

$$\{d_i(t) \mid t = 1, \ldots, 2n, \ i = 0, \ldots, 2^{\frac{n}{2}} - 2\} \qquad \text{Equation (3)}$$

$$d_i(t) = \begin{pmatrix} 0, & \text{if } t = 1 \\ m_d(t + i - 2), & \text{if } t = 1, 2, 3, \ldots, 2^n \end{pmatrix}$$

The calculated sequence families di(t) are mask functions which can be used as 7 masks.

One of the properties of the calculated sequence families di(t) is that a mask created by adding two different masks out of the above masks becomes another mask out of the $2^{(n/2)}-1$ masks. To generalize further, all of the $2^{(n/2)}-1$ masks including a mask of all 0's can be represented by a predefined sum of n masks out of the $2^{(n/2)}-1$ masks. The n masks are defined as basis sequences (or basis sequences).

The total number of codewords required in creating the $(2^n,n+k)$ code is $2^{n+k}$ which is the number of possible sets of the input information bits. Here, the number of biorthogonal sequences indicating $2^n$ orthogonal sequences (or Walsh sequences) and their complements is $2^n \times 2 = 2^{n-1}$, and the number of non-zero masks required to create the $(2^n,n+k)$ code is $(2^{n+k}/2^{n+1})-1=2^{k-1}-1$. In addition, all of the $2^{k-1}-1$ masks can also be represented by a predefined sum of the $(k-1)$ masks on the basis of the property similar to that described above.

Next, a method for selecting the $(k-1)$ masks will be described. In step 630, a sequence family is created by cyclic-shifting the $m_2(t)$ 0 to $2^{(n/2)-1}$ times. An m-sequence created by cyclic-shifting the $m_2(t)$ i times can be expressed as $Tr(\alpha^i \cdot \alpha^t)$ using Equation (1). That is, a sequence family created by cyclic-shifting the $m_2(t)$ 0 to 6 times include the sequences created according to initial values $A=1,\alpha, \ldots, \alpha^{2^n-2}$. At this moment, $(k-1)$ linearly independent basis elements are searched from the Galois elements $1,\alpha, \ldots, \alpha^{2^n-2}$. The sequences corresponding to the output sequences of the trace function taking the $(k-1)$ basis elements as initial values become basis mask sequences. In this process, the linearly independent condition is represented by Equation (4) below.

$$\alpha_1, \ldots, \alpha_{k-1}: \text{linearly independent} \Leftrightarrow c_1\alpha_1 + c_2\alpha_2 + \ldots + c_{k-1}\alpha_{k-1} \neq 0, \forall c_1, c_2, \ldots, c_{k-1} \quad \text{Equation (4)}$$

A method for creating the generalized mask function will be described with reference to FIG. 6, for the case where a (64,10) code is created using the Kasami sequence family. Actually, it is well known that the Kasami sequence is represented by the sum of the different m-sequences. Therefore, in order to create the (64,10) code, a Kasami sequence of length 63 must be created first. The Kasami sequence is comprised of an m-sequence created by a generator polynomial $x^6+x+1$ and a sequence created by repeating $2^{(n/2)}+1$ times a sequence of length $2^{(n/2)}-1$ determined by decimating the m-sequence in a unit of $2^{(n/2)}+1$. Here, if the generator polynomial is determined, each m-sequence m(t) can be calculated using the trace finction as shown in Equation (5) below.

$$m_1(t) = Tr(A\alpha^t), t = 0, 1, \ldots, 63 \quad \text{Equation (5)}$$

$$\text{where,} \quad Tr(\alpha) = \sum_{n=0}^{4} \alpha^{2^n}, \alpha \in GF(2^5)$$

In Equation (5), A indicates a value determined according to an initial value of the m-sequence and a indicates a root of the generator polynomial. In addition, n=6 because the generator polynomial is of the $6^{th}$ degree.

FIG. 6 illustrates a procedure for creating the mask function in the case where the (64,10) code (i.e., a code for outputting a 64-bit coded symbol by receiving 10 input information bits) is created using a Kasami sequence family among the above-stated sequence families. Referring to FIG. 6, in step 610, an m-sequence $m_1(t)$ created by the generator polynomial $x^6+x+1$ and a sequence $m_2(t)$ obtained by repeating $2^{(n/2)}+1$ times a sequence of length $2^{(n/2)}-1$ determined by decimating the m-sequence $m_2(t)$ in a unit of $2^{(n/2)}+1$ are calculated in accordance with Equation (5). In step 620, a column permutation function σ(t) for converting the m-sequence $m_1(t)$ into a Walsh code shown in Equation (6) below is calculated.

$$\sigma: \{0, 1, 2, \ldots, 63\} \to \{1, 2, \ldots, 64\} \quad \text{Equation (6)}$$

$$\sigma(t) = \sum_{i=0}^{4} m_1(t)2^{4-i}$$

In step 630, 7 sequence families obtained by cyclic-shifting the m-sequence $m_2(t)$ 0 to 6 times are subjected to column permutation using $\sigma^{-1}(t)+2$, where $\sigma^{-1}(t)$ is an inverse function of the column permutation function σ(t) for converting the sequence $m_1(t)$ to the Walsh code. Further, '0' is added to the head of every sequence created by the column permutation so as to make the sequences have a length 64, thereby creating 7 sequence families $d_i(t)$ of length 64, where i=0, . . . ,6 and t=1, . . . ,64. The sequence families created in step 630 can be represented by Equation (7) below.

$$\{d_i(t) \mid t = 1, \ldots, 64, \ i = 0, \ldots, 6\} \quad \text{Equation (7)}$$

$$d_i(t) = \begin{pmatrix} 0, & \text{if } t = 1 \\ m_d(t+i-2), & \text{if } t = 1, 2, 3, \ldots, 64 \end{pmatrix}$$

The sequence families $d_i(t)$ calculated by Equation (7) are mask functions which can be used as 7 mask sequences.

One of the properties of the calculated sequence families $d_i(t)$ is that a mask created by adding two different masks out of the above masks becomes another mask out of the 7 masks. To generalize further, all of the 7 masks can be represented by a predefined sum of 3 masks out of the 7 masks. As mentioned above, all of the mask sequences which can be represented by the predefined sum of the masks, are defined as basis sequences.

The total number of codewords required in creating the (64,10) code is $2^{10}=1024$, which is the number of possible sets of the input information bits. Here, the number of biorthogonal codewords of length 64 is 64×2=128, and the number of masks required to create the (64,10) code is (1024/128)−1=7. In addition, all of the 7 masks can also be represented by a predefined sum of the 3 masks on the basis of the property similar to that described above. Therefore, a method for selecting the 3 masks is required. The method for selecting the 3 masks will be described below. In step 630, a sequence family is created by cyclic-shifting the $m_2(t)$ 0 to 6 times. An m-sequence created by cyclic-shifting the $m_2(t)$ i times can be expressed as $Tr(\alpha^i \cdot \alpha^t)$ using Equation (5). That is, a sequence family created by cyclic-shifting the $m_2(t)$ 0 to 6 times include the sequences created according to initial values $A=1,\alpha, \ldots, \alpha^6$. At this moment, 3 linearly independent basis elements are searched from the Galois elements $1,\alpha, \ldots, \alpha^6$. It is possible to create all the 7 masks by the predefined sum of the 3 masks by selecting the sequences taking the 3 basis elements as initial values. In this process, the linearly independent condition is represented by Equation (8) below.

$$\alpha,\beta,\gamma,\delta: \text{linearly independent} \Leftrightarrow c_1\alpha+c_2\beta+c_3\gamma+c_4\Delta \neq 0, \forall c_1,c_2,c_3,\ c_4 \quad \text{Equation (8)}$$

Actually, 1, α and $\alpha^2$ in the Galois field $GF(2^3)$ are basis polynomials well known as the above 4 linear independent elements. Therefore, the following 3 mask functions M1, M2 and M4 are calculated by substituting the basis polynomials into Equation (5)

M1=0011010101101111101000110000011011111011001 0100111001111111000101

M2=01000111110100011110110101111011011111101100 0100101101000110111000

M4=0001100011100111110101001101010010111011 0111101011100011000111 0

Now, a detailed description will be made regarding an apparatus and method for encoding and decoding a TFCI in a NB-TDD CDMA mobile communication system according to an embodiment of the present invention. In the embodiments of the present invention, the encoder and the decoder use the basis mask sequences calculated in the above method. Specifically, a method for creating the basis mask sequences will be described below.

First Embodiment

Figure 7A:
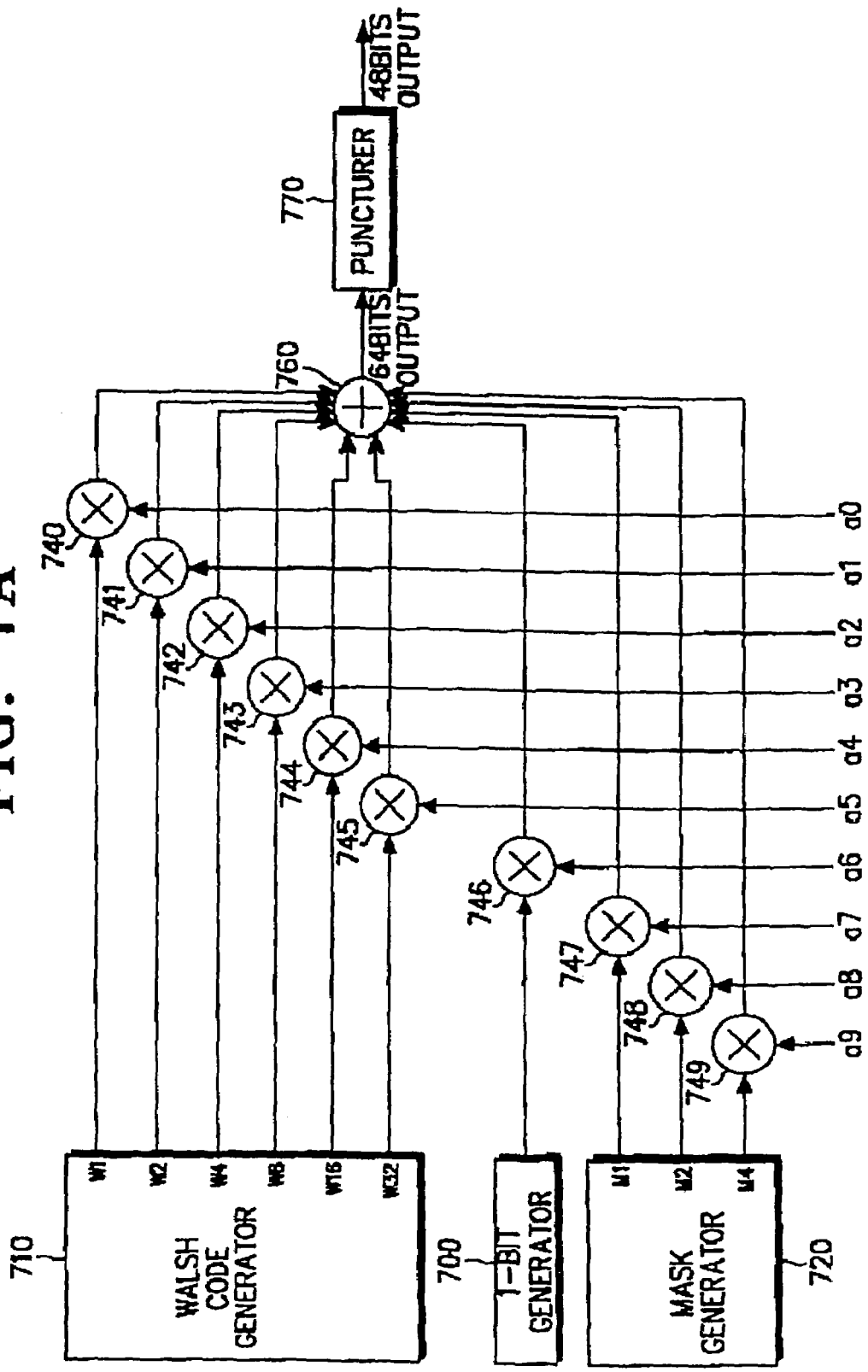
FIG. 7A is a diagram illustrating an apparatus for encoding a TFCI according to a first embodiment of the present invention.
Figure 10:
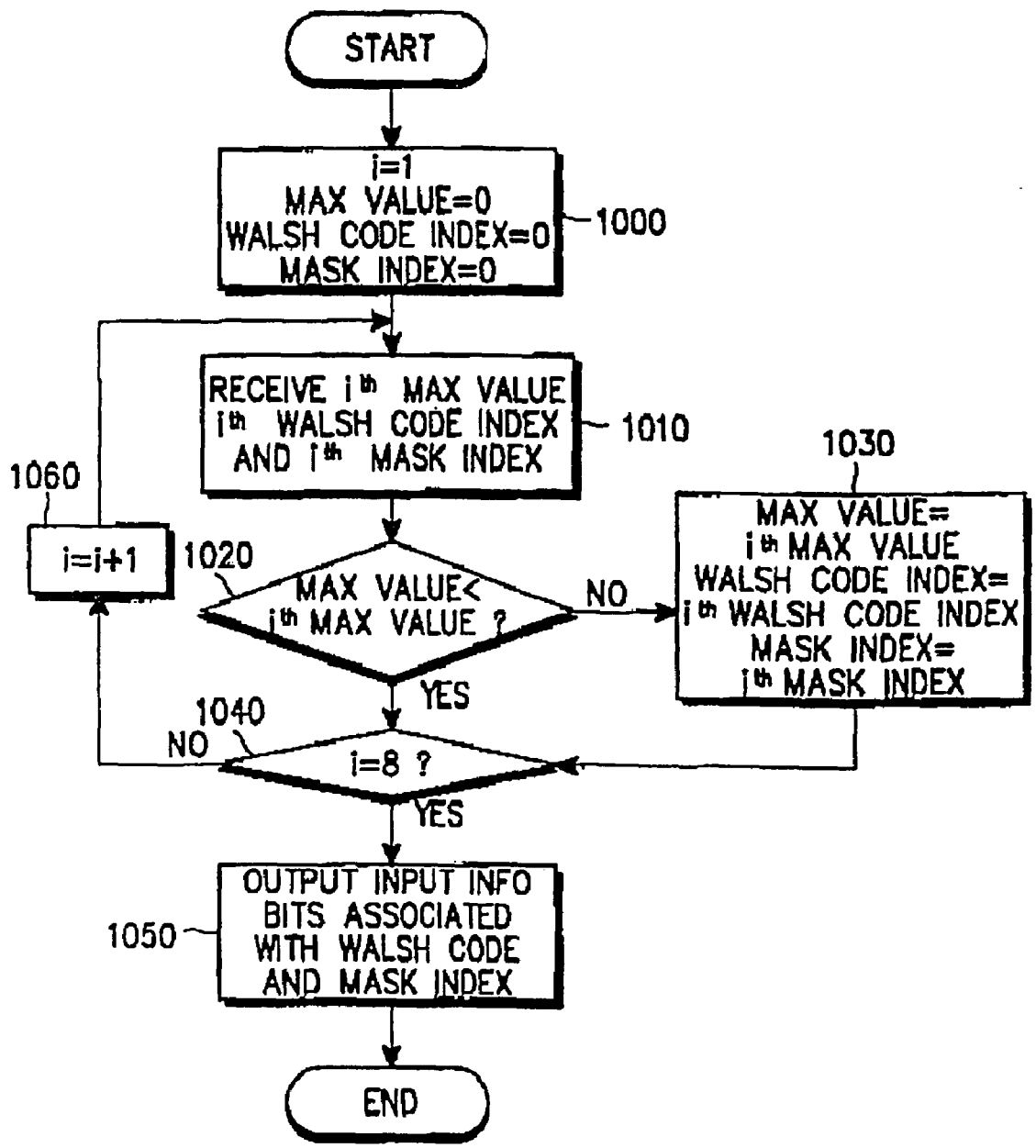
FIG. 10 is a flow chart illustrating an operation performed by the comparator shown in FIG. 9.

FIG. 7A illustrates an apparatus for encoding a TFCI in a NB-TDD CDMA mobile communication system according to a first embodiment of the present invention. Referring to FIG. 7A, 10 input information bits a0–a9 are provided to their associated multipliers 740–749, respectively. A basis Walsh code generator 710 generates basis Walsh codes having a predetermined length. Here, the "basis Walsh codes" refer to predetermined Walsh codes, by a predetermined sum of which all of desired Walsh codes can be created. For example, for a Walsh code of length 64, the basis Walsh codes include a $1^{st}$ Walsh code W1, a $2^{nd}$ Walsh code W2, a $4^{th}$ Walsh code W4, an $8^{th}$ Walsh code W8, a $16^{th}$ Walsh code W16 and a $32^{nd}$ Walsh code W32. A 1-bit generator 700 continuously generates a predetermined code bit. That is, as the invention is applied to the biorthogonal sequences, the 1-bit generator 700 generates a bit required for using orthogonal sequences as biorthogonal codes. For example, the 1-bit generator 700 constantly generates a bit having a value '1', thereby to invert the Walsh codes generated from the basis Walsh code generator 710.

The Walsh code generator 710 simultaneously outputs Walsh codes W1, W2, W4, W8, W16 and W32 of length 64. The multiplier 740 multiplies the $1^{st}$ Walsh code W1 (=0101010101010101010101010101010101010101 010101010101010101) from the Walsh code generator 710 by the first input information bit a0. The multiplier 741 multiplies the $2^{nd}$ Walsh code W2 (=0011001100110011001 1001100110011001100110011001100110011) from the Walsh code generator 710 by the second input information bit a1. The multiplier 742 multiplies the $4^{th}$ Walsh code W4 (=00001111000011110000111100001111 0000111100001111000011110000111100001111) from the Walsh code generator 710 by the third input information bit a2. The multiplier 743 multiplies the $8^{th}$ Walsh code W8 (=00000000 1111111100000000111111110000000011111111 1100000000111111111) from the Walsh code generator 710 by the fourth input information bit a3. The multiplier 744 multiplies the $16^{th}$ Walsh code W16 (=0000000000000000 0111111111111111100000000000000001111111111111111) from the Walsh code generator 710 by the fifth input information bit a4. The multiplier 745 multiplies the $32^{nd}$ Walsh code W32 (=000000000000000000000000000000000 1111111111111111 1111111111111111) from the Walsh code generator 710 by the sixth input information bit a5. That is, the multipliers 740–745 multiply the input basis Walsh codes W1, W2, W4, W8, W16 and W32 by their associated input information bits a0–a5 in a symbol unit. Meanwhile, the multiplier 746 multiplies the symbols of all 1's output from the 1-bit generator 700 by the seventh input information bit a6.

A mask generator 720 generates mask sequences having a predetermined length. The method for generating the mask sequences will not be described, since it has already been described above. For example, when the (64,10) code is generated using the Kasami sequence, the basis mask sequences include a $1^{st}$ mask sequence M1, a $2^{nd}$ mask sequence M2 and a $4^{th}$ mask sequence M4. The mask generator 720 simultaneously outputs the mask functions M1, M2 and M4 of length 64. The multiplier 747 multiplies the $1^{st}$ mask function M1 (=0011010101101111101000110 0000110111101100101001110011111110000101) from the mask generator 720 by the eighth input information bit a7. The multiplier 748 multiplies the $2^{nd}$ mask function M2 (=010001111101000111101101011110110111101100010 01101000110111000) from the mask generator 720 by the ninth input information bit a8. The multiplier 749 multiplies the $4^{th}$ mask function M4 (0001100011100111110101001 101010010111101101110101110001110) from the mask generator 720 by the tenth input information bit a9. The multipliers 747–749 multiply the input basis mask sequences M1, M2 and M4 by the associated input information bits a7–a9 in a symbol unit.

An adder 760 adds (or XORS) the symbols output from the multipliers 740–749 in a symbol unit, and then, outputs 64 coded symbols. A symbol puncturer 770 punctures the 64 symbols output from the adder 760 according to a predetermined rule and outputs 48 symbols. That is, the (48,10) encoder punctures 16 symbols from the 64 symbols created by the (64,10) code. The minimum distance of the (48,10) encoder varies depending on the positions of the 16 punctured symbols. Combinations of the 16 punctured positions, providing superior performance, are shown below. When using the following combinations of the punctured positions, the (48,10) encoder has the minimum distance of 18 and provides superior weight distribution.

{0, 4, 8,13,16,20,27,31,34,38,41,44,50,54,57,61}
{0, 4, 8,13,16,21,25,28,32,37,43,44,49,52,56,62}
{0, 4, 8,13,16,21,25,31,32,37,43,44,49,52,56,61}
{0, 4, 8,13,18,21,25,30,35,36,40,46,50,53,57,62}
{0, 4, 8,13,18,21,25,30,35,37,40,47,50,53,57,62}
{0, 4, 8,13,19,22,27,30,33,36,41,44,49,55,58,61}
{0, 4, 8,13,19,22,27,30,33,36,41,44,50,52,56,63}
{0, 4, 8,13,19,22,27,30,33,36,41,44,50,52,58,61}
{0, 4, 8,13,16,20,27,31,34,38,41,44,50,54,57,61}

Figure 8:
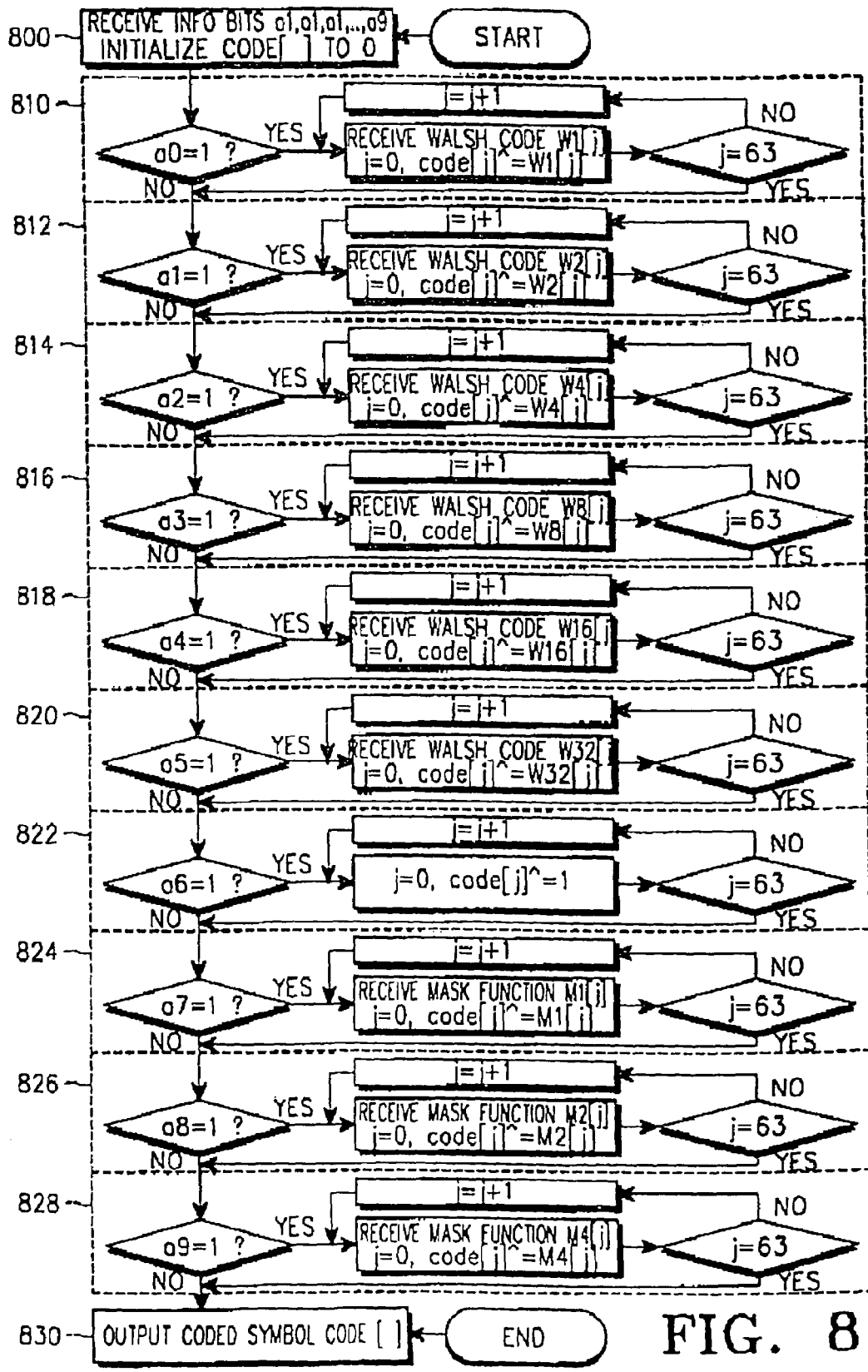
FIG. 8 is a flow chart illustrating an operation performed by the encoder of FIG. 7A.

FIG. 8 illustrates a control flow for encoding a TFCI in an NB-TDD CDMA mobile communication system according to the first embodiment of the present invention. Referring to FIG. 8, in step 800, a sequence of 10 input information bits a0–a9 is input and then, parameters code[ ] and j are initialized to '0'. The parameter code[ ] indicates the 64 coded symbols finally output from the encoder and the parameter j is used to count the 64 symbols constituting one codeword.

Thereafter, it is determined in step 810 whether the first information bit a0 is '1'. If the first information bit a0 is '1', the $1^{st}$ Walsh code W1 (=010101010101010101010101010 1010101010101010101010101010101010101) is XORed with the coded symbol sequence parameter code[ ] of length 64. Otherwise, if the first information bit a0 is not '1', the control flow skips to step 812. After step 810, it is determined in step 812 whether the second information bit a1 is '1'. If the second information bit a1 is '1', the $2^{nd}$ Walsh code W2 (=0011001100110011001100110011001100110011 1001100110011001100110011) is XORed with the coded symbol sequence parameter code[ ] of length 64. Otherwise, if the second information bit a1 is not '1', the control flow skips to step 814. After step 812, it is determined in step 814 whether the third information bit a2 is '1'. If the third information bit a2 is '1', the 4$^{th}$ Walsh code W4(=0000111100001111000011110000111100001110000 1111000011110000111111) is XORed with the coded symbol sequence parameter code[ ] of length 64. Otherwise, if the third information bit a2 is not '1', the control flow skips to step 816. After step 814, it is determined in step 816 whether the fourth information bit a3 is '1'. If the fourth information bit a3 is '1', the 8$^{th}$ Walsh code W8 (=0000000011111111 00000000111111110000000011111111000000001111111) is XORed with the coded symbol sequence parameter code[ ] of length 64. Otherwise, if the fourth information bit a3 is not '1', the control flow skips to step 818. After step 816, it is determined in step 818 whether the fifth information bit a4 is '1'. If the fifth information bit a4 is '1', the 16$^{th}$ Walsh code W16(=0000000000000000111111111111111 100000000000000001111111111111111) is XORed with the coded symbol sequence parameter code[ ] of length 64. Otherwise, if the fifth information bit a4 is not '1', the control flow skips to step 820. After step 818, it is determined in step 820 whether the sixth information bit a5 is '1'. If the sixth information bit a5 is '1', the 32$^{nd}$ Walsh code W32(=000000000000000000000000000000001111111111 11111111111111111111) is XORed with the coded symbol sequence parameter code[ ] of length 64. Otherwise, if the sixth information bit a5 is not '1', the control flow jumps to step 822.

After step 820, it is determined in step 822 whether the seventh information bit a6 is '1'. If the seventh information bit a6 is '1', a sequence of all 1's is XORed with the coded symbol sequence parameter code [ ] of length 64. Otherwise, if the seventh information bit a6 is not '1', the control flow jumps to step 824. That is, in step 822, the Walsh code created in the preceding steps is XORed by 1 thereby to create a biorthogonal code. More specifically, if the seventh information bit a6 is '1', the parameter j is initialized to '0' and a j$^{th}$ parameter code[j] is XORed with '1'. Further, it is determined whether the parameter j is 63, in order to determine whether the parameter j is the last symbol of the codeword. If the parameter j is not 63, this process is repeated after increasing the parameter j by 1. In other words, in step 822, when the seventh information bit a6 is '1', a length-64 sequence of all 1's is XORed with a coded symbol sequence of length 64. Therefore, after repeating this process 64 times, the control flow proceeds to step 824 from the step for determining whether the parameter j is 63.

After step 822, it is determined in step 824 whether the eighth information bit a7 is '1'. If the eighth information bit a7 is '1', the first mask function M1 (=0011010101101111 1010001100000110111101100101001110011111) is XORed with the coded symbol sequence parameter code[ ] of length 64. Otherwise, if the eighth information bit a7 is not '1', the control flow skips to step 826. After step 824, it is determined in step 826 whether the ninth information bit a8 is '1'. If the ninth information bit a8 is '1', the second mask function M2 (=0100011110100011110110101111 0110111101100010010110100011011100) is XORed with the coded symbol sequence parameter code[ ] of length 64. Otherwise, if the ninth information bit a8 is not '1', the control flow skips to step 828. After step 826, it is determined in step 828 whether the tenth information bit a9 is '1'. If the tenth information bit a9 is '1', the fourth mask function M4 (=000110001110011111010100110101001011110110 1111010111000110001110) is XORed with the coded symbol sequence parameter code[ ] of length 64. Otherwise, if the tenth information bit a9 is not '1', the control flow skips to step 830. In step 830, only the sequences corresponding to information bits 1's out of the 10 sequences W1, W2, W4, W8, W16, W32, 1, M1, M2 and M4 of length 64 associated respectively with the 10 input information bits a0–a9 are all XORed to output a value of the coded symbol sequence parameter code[ ].

The (64,10) encoder operating in the method of FIG. 8 creates 64 Walsh codes of length 64, 64 inverted Walsh codes determined by inverting the 64 Walsh codes, and a total of 896 codes determined by the combination of a total of 7 mask sequences calculated by the combination of a total of 128 orthogonal codes and 3 mask functions. Therefore, the total number of codewords is 1024. In addition, a (64,9) encoder creates 64 Walsh codes of length 64, Walsh codes calculated by adding all 1's to (or multiplying −1 by, in case of a real number) symbols of every Walsh code among the 1024 codewords, and codes determined by combining a total of 4 mask functions calculated by the combination of a total of 128 orthogonal codes and 2 mask functions among the 3 mask functions, and a (64,8) encoder creates 64 Walsh codes of length 64, Walsh codes calculated by adding all 1's to (or multiplying −1 by, in case of a real number) symbols of every Walsh code among the 1024 codewords, and codes determined by combining a total of 2 mask functions calculated by the combination of a total of 128 biorthogonal codes and 1 mask function among the 3 mask functions. The (64,9) encoder and the (64,8) encoder both have a minimum distance of 28. The (64,9) encoder can be realized using only two of the 3 mask functions output from the mask function generator 720 of FIG. 7A, while the (64,8) encoder can be realized using only one of the 3 mask functions output from the mask function generator 720. As stated above, the encoder can adaptively perform encoding according to the number of input information bits, and can also have superior performance by increasing the minimum distance determining the performance of the encoder, as high as possible.

Figure 11:
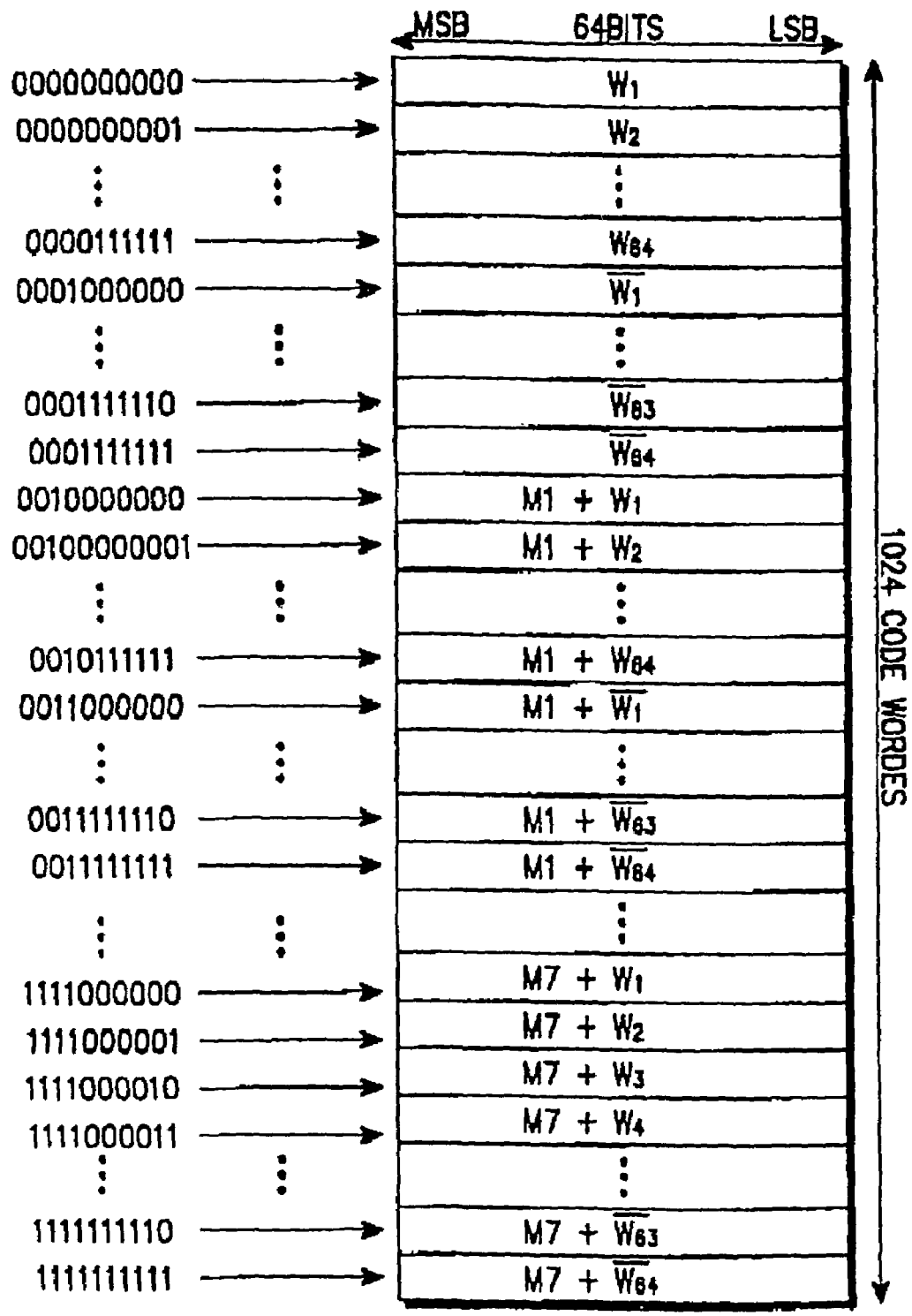
FIG. 11 is a diagram illustrating a structure of 1024 codes output from a (64,10) encoder according to an embodiment of the present invention.

The (64,10) encoder uses, as codewords, 64 Walsh codes of length 64, 64 inverted Walsh codes calculated by inverting the 64 Walsh codes, and 896 sequences calculated by combining a total of 128 biorthogonal codes with 7 masks functions of length 64, the structure of which is illustrated in FIG. 11.

Figure 9:
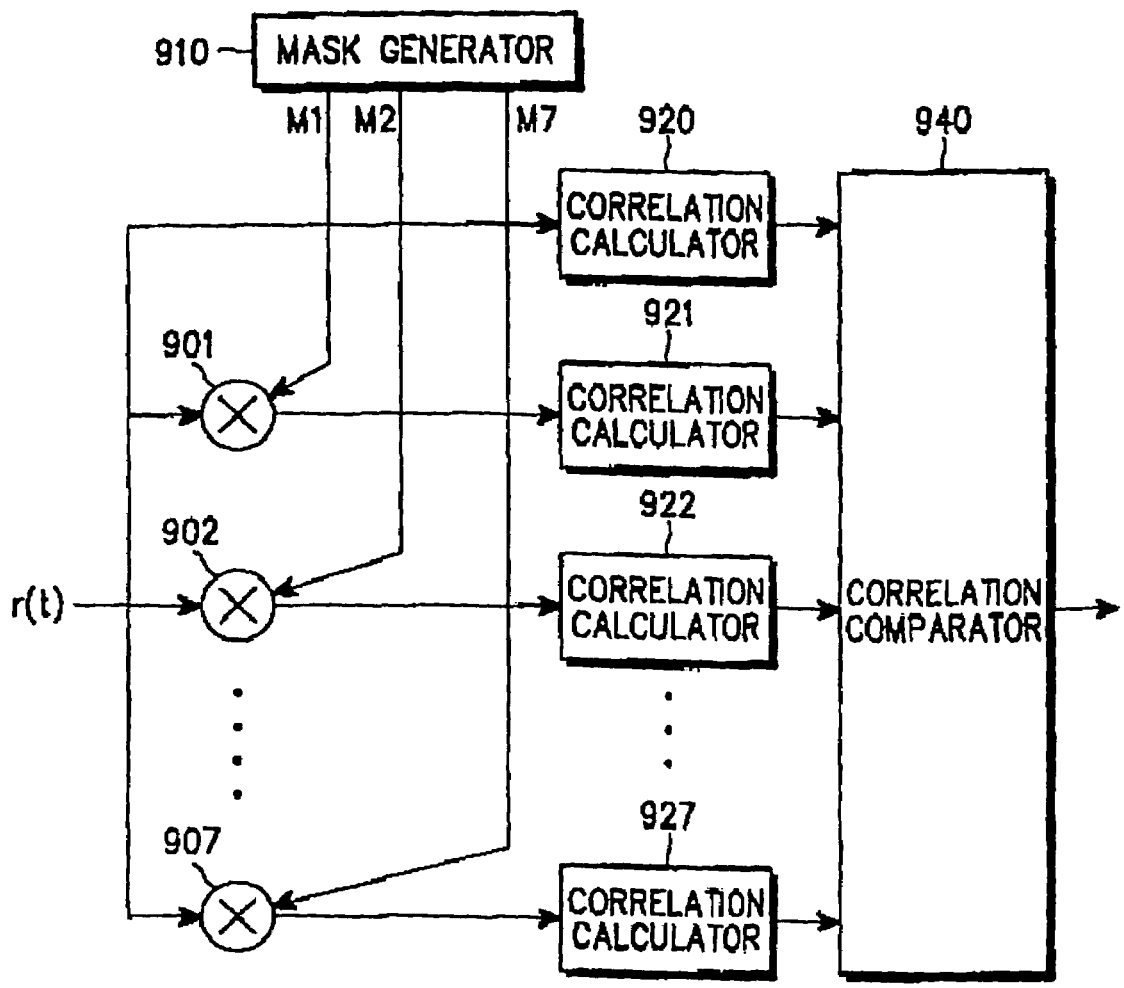
FIG. 9 is a diagram illustrating an apparatus for decoding a TFCI according to an embodiment of the present invention.

FIG. 9 illustrates an apparatus for decoding a TFCI according to an embodiment of the present invention. Referring to FIG. 9, the decoder inserts '0' in the positions, punctured by the encoder, of a received signal corresponding to the TFCI symbol of length of 48, having a value of +1/−1, thereby to create a received signal r(t) of length 64. The received signal r(t) is provided to 7 multipliers 901–907 and a correlation calculator 920. The received signal r(t) is a signal encoded by a predetermined Walsh code and a predetermined mask sequence in the encoder of the transmitter. A mask generator 910 creates possible mask functions M1–M7 which can be created by 3 basis masks, and provides the generated mask functions to multipliers 901–907, respectively. The multiplier 901 multiplies the received signal r(t) by the mask function M1 output from the mask generator 910, and provides its output to a correlation calculator 921. The multiplier 902 multiplies the received signal r(t) by the mask function M2 output from the mask generator 910, and provides its output to a correlation calculator 922. The multiplier 907 multiplies the received signal r(t) by the mask function M7 output from the mask generator 910, and provides its output to a correlation calculator 927. That is, the multipliers 901–907 multiply the received signal r(t) by their associated mask functions M1–M7 from the mask generator 910, and provide their outputs to the associated correlation calculators 921–927, respectively. By doing so, the received signal r(t) and the signals calculated by multiplying the received signal r(t) by the possible 7 mask functions, i.e., a total of 8 signals are provided to the 8 correlation calculators 920–927, respectively. If the transmitter has encoded the TFCI using a predetermined mask function, any one of the outputs from the multipliers 901–907 will be a mask function-removed signal. Then, the correlation calculators 920–927 calculate 128 correlation values by correlating the received signal r(t) and the outputs of the multipliers 901–907 with 64 Walsh codes of length 64 and 64 inverted Walsh codes calculated by inverting the 64 Walsh codes, i.e., a total of 128 bi-Walsh (or biorthogonal) codes. The largest one of the calculated correlation values, an index of then-correlated Walsh code and an index of the correlation calculator are provided to a correlation comparator 940. The 128 Walsh codes have already been defined above. The correlation calculator 920 calculates 128 correlation values by correlating the received signal r(t) with 128 bi-Waish codes of length 64. Further, the correlation calculator 920 provides the correlation comparator 940 with the largest one of the calculated correlation values, an index of then-calculated Walsh code and an index '0' of the correlation calculator 920. Here, the index of the correlation calculator is equivalent to an index of the mask function indicating which mask function is multiplied by the received signal for the signal input to the correlation calculator. However, the mask index '0' means that no mask is multiplied by the received signal. Further, the correlation calculator 921 also calculates 128 correlation values by correlating the received signal r(t) multiplied by the mask function M1 by the multiplier 901 with 128 bi-Walsh codes of length 64. Further, the correlation calculator 921 provides the correlation comparator 940 with the largest one of the calculated correlation values, an index of then-calculated Walsh code and an index '1' of the correlation calculator 921. The correlation calculator 922 calculates 128 correlation values by correlating the received signal r(t) multiplied by the mask function M2 by the multiplier 902 with 128 bi-Walsh codes of length 64. Further, the correlation calculator 922 provides the correlation comparator 940 with the largest one of the 128 calculated correlation values, an index of then-calculated Walsh code and an index '2' of the correlation calculator 922. The correlation calculator 927 calculates 128 correlation values by correlating the received signal r(t) multiplied by the mask function M7 by the multiplier 907 with 128 bi-Walsh codes of length 64. Further, the correlation calculator 927 provides the correlation comparator 940 with the largest one of the calculated correlation values, an index of then-calculated Walsh code and an index '7' of the correlation calculator 927.

The correlation comparator 940 then compares the 8 largest correlation values provided from the correlation calculators 920–927, and determines the largest one of them. After determining the largest correlation value, the correlation comparator 940 outputs TFCI information bits transmitted from the transmitter according to the index of the Walsh code provided from the correlation calculator associated with the determined correlation value and an index (or mask index) of the same correlation calculator. That is, the correlation comparator 940 determines a decoded signal of the received signal using the index of the Walsh code and the index of the mask function.

FIG. 10 illustrates a procedure for determining a Walsh code index and a mask function index for the largest correlation value by comparing the 8 correlation values in the correlation comparator 940 according to the first embodiment of the present invention, and outputting the TFCI information bits accordingly. Referring to FIG. 10, in step 1000, a frequency indicating index parameter i is initialized to 1, and a maximum value, a Walsh code index and a mask index are all initialized to '0'. In step 1010, the correlation value, the Walsh code index for the correlation value and the mask index, output from the first correlation calculator 920, are stored as a first maximum value, a first Walsh code index and a first mask sequence index, respectively. Thereafter, in step 1020, the first maximum value is compared with a previously stored maximum value. If the first maximum value is larger than the previously stored maximum value, the procedure goes to step 1030. Otherwise, if the first maximum value is smaller than or equal to the previously stored maximum value, the procedure proceeds to step 1040. In step 1030, the first maximum value is designated as the maximum value, and the first Walsh code index and the first mask index are designated as the Walsh code index and the mask index, respectively. In step 1040, a value set for the index parameter i is compared with the number '8' of the correlation calculators, in order to determine whether comparison has been completely performed on all of the 8 correlation values. If the frequency indicating index i is not equal to the number '8' of the correlation calculators in step 1040, the correlation comparator 940 increases the frequency indicating index i by 1 in step 1060 and thereafter, returns to step 1010 to repeat the above-described process using the $i^{th}$ maximum value, the $i^{th}$ Walsh code index and the $i^{th}$ mask index, output from the increased $i^{th}$ correlation calculator. After the above process is repeatedly performed on the $8^{th}$ maximum value, the $8^{th}$ Walsh code index and the $8^{th}$ mask index, the frequency indicating index i becomes 8. Then, the procedure goes to step 1050. In step 1050, the correlation comparator 940 outputs decoded bits (TFCI information bits) associated with the Walsh code index and the mask index. The Walsh code index and the mask index corresponding to the decoded bits are the Walsh code index and the mask index corresponding to the largest one of the 8 correlation values provided from the 8 correlation calculators.

In the first embodiment, the (48,10) encoder creates 48 symbols by puncturing 16 symbols after creating 64 codes. In the second embodiment below, however, unlike FIG. 7A, the encoder outputs 48 symbols after puncturing 16 symbols according to a predetermined puncturing pattern in the Walsh code generator, the 1-bit generator and the mask generator.

Second Embodiment

The encoding apparatus according to the second embodiment of the present invention is similar in structure to the encoder described with reference to the first embodiment. However, the only difference is that the sequences output from the 1-bit generator, the Walsh code generator and the mask generator are the sequences of length 48, to which a puncturing pattern is previously applied. For example, the sequences output from the Walsh code generator, the 1-bit generator and the mask generator according to the first embodiment, from which $0^{th}$, $4^{th}$, $8^{th}$, $13^{th}$, $16^{h}$, $20^{h}$, $27^{th}$, $31^{st}$, $34^{th}$, $38^{th}$, $41^{st}$, $44^{th}$, $50^{th}$, $54^{th}$, $57^{th}$ and $61^{st}$ terms are punctured, are used in the second embodiment.

Figure 7B:
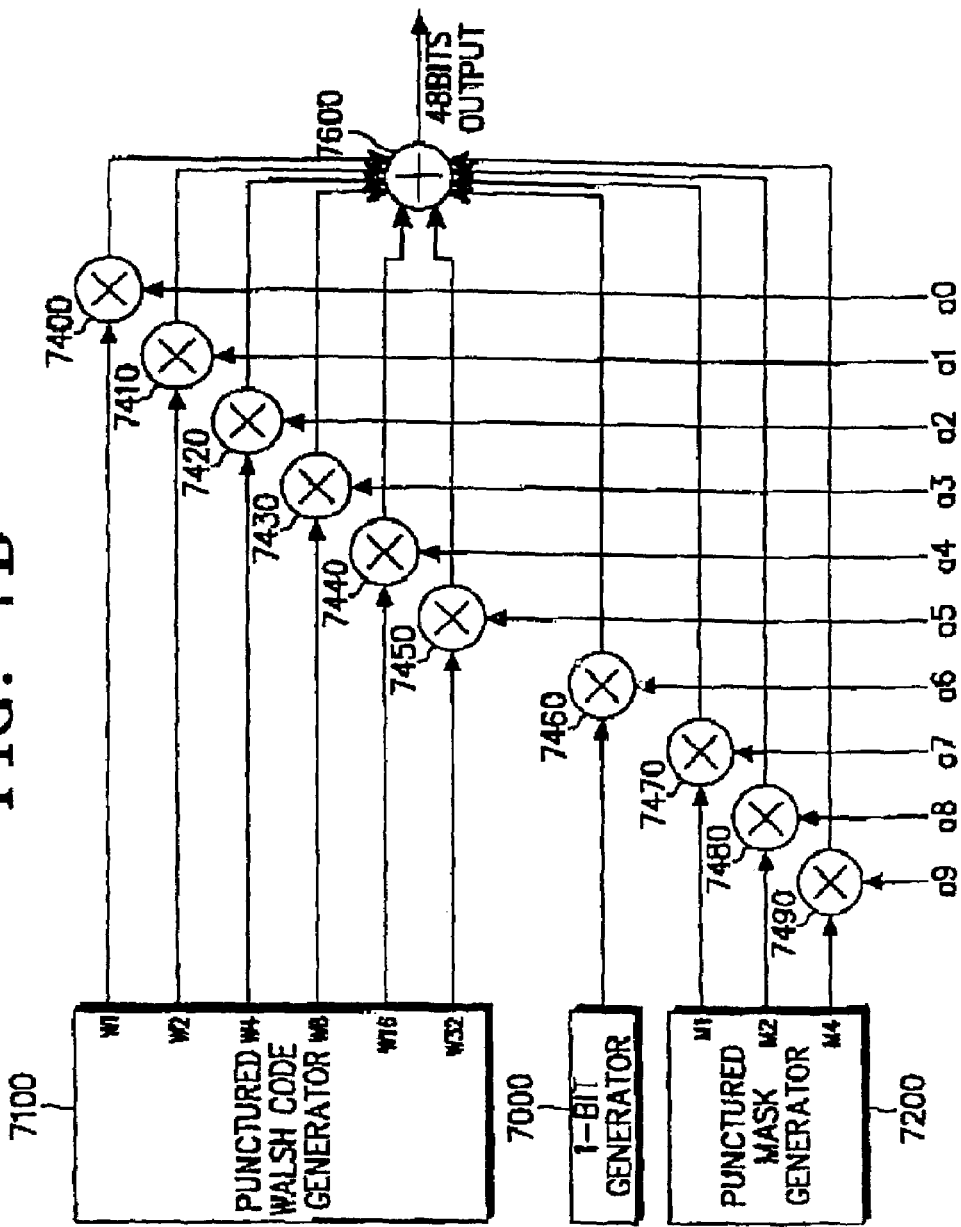
FIG. 7B is a diagram illustrating an apparatus for encoding a TFCI according to a second embodiment of the present invention.

FIG. 7B illustrates an apparatus for encoding a TFCI in an NB-TDD CDMA mobile communication system according to the second embodiment of the present invention. Referring to FIG. 7B, 10 input information bits a0–a9 are provided to their associated multipliers 7400, 7410, 7420, 7430, 7440, 7450, 7460, 7470, 7480 and 7490, respectively. A basis Walsh code generator 7100 simultaneously generates Walsh codes W1', W2', W4', W8', W16' and W32' of length 48, calculated by puncturing the basis Walsh codes according to a predetermined puncturing rule as described above. Here, the "basis Walsh codes" refer to predetermined Walsh codes, by a predetermined sum of which all of desired Walsh codes can be created. For example, for a Walsh code of length 64, the basis Walsh codes include a $1^{st}$ Walsh code W1, a $2^{nd}$ Walsh code W2, a $4^{th}$ Walsh code W4, an $8^{th}$ Walsh code W8, a $16^{th}$ Walsh code W16 and a $32^{nd}$ Walsh code W32. A 1-bit generator 7000 continuously generates a predetermined code bit. The multiplier 7400 multiplies the Walsh code W1' (=101101101001101101010010011011001 101011011001001) punctured according to a predetermined puncturing rule by the Walsh code generator 7100 by the input information bit a0. The multiplier 7410 multiplies the punctured Walsh code W2' (=011011011011011011001001 00100101101100100101101) from the Walsh code generator 7100 by the input information bit a1. The multiplier 7420 multiplies the punctured Walsh code W4' (=000111000111 000111000111000111000111000111000111) from the Walsh code generator 7100 by the input information bit a2. The multiplier 7430 multiplies the punctured Walsh code W8' (=0000001111110000001111110000001111110000001 11111) from the Walsh code generator 7100 by the input information bit a3. The multiplier 7440 multiplies the punctured Walsh code W16' (=000000000000111111111100000 0000000111111111111) from the Walsh code generator 7100 by the input information bit a4. The multiplier 7450 multiplies the punctured Walsh code W32' (=000000000000000 000000000111111111111111111111111) from the Walsh code generator 7100 by the input information bit multiplier 7460 multiplies the symbols of all 1's output from the 1-bit generator 7000 by the input information bit a6.

A mask generator 7200 simultaneously outputs punctured basis mask functions M1', M2' and M4' of length 48, determined by puncturing the basis masks according to a predetermined puncturing pattern. The method for creating the mask functions will not be described, since it has already been described above. The multiplier 7470 multiplies the punctured mask function M1' (=011101110111010011000 011111010001011101111100001) from the mask generator 7200 by the input information bit a7. The multiplier 7480 multiplies the punctured mask function M2' (=1001111010 01110101011101011101001010111001111100) from the mask generator 7200 by the input information bit a8. The multiplier 7490 multiplies the punctured mask function M4' (=001000110011101100110010101111111110101100110 01 10) from the mask generator 7200 by the input information bit a9. That is, the multipliers 7470–7490 multiply the input basis mask sequences M1', M2' and M4' by the associated input information bits a7–a9 in a symbol unit. An adder 7600 then adds (or XORs) the symbols output from the multipliers 7400–7490 in a symbol unit, and outputs 48 coded symbols (TFCI symbols).

Figure 12:
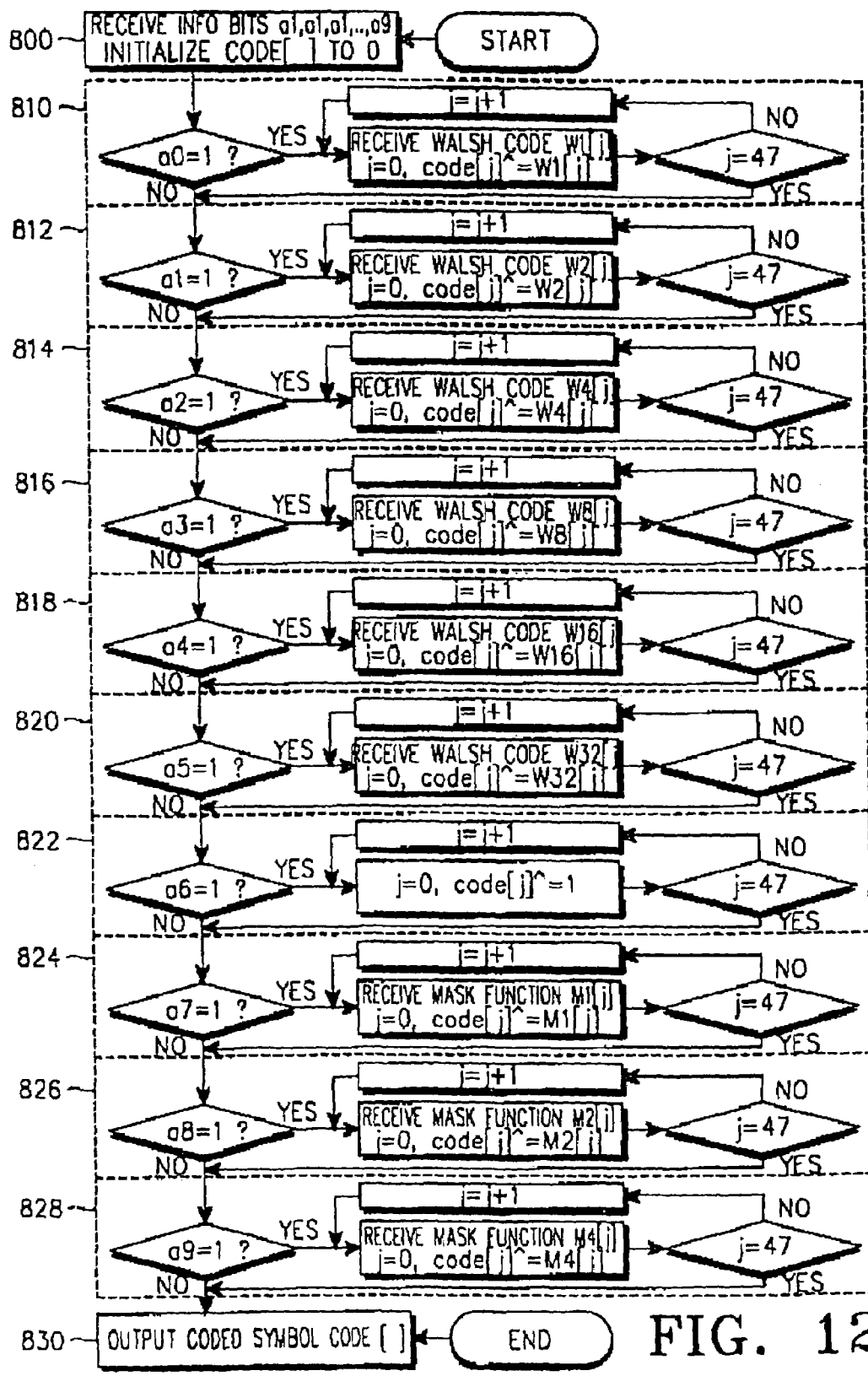
FIG. 12 is a flow chart illustrating an operation performed by the encoder of FIG. 7B.

FIG. 12 illustrates a control flow for encoding a TFCI in an NB-TDD CDMA mobile communication system according to the second embodiment of the present invention. Referring to FIG. 12, in step 1200, a sequence of 10 input information bits a0–a9 is input and then, parameters code[ ] and j are initialized to '0'. Here, the coded symbol sequence parameter code[ ] indicates the 48 coded symbols finally output from the encoder and the parameter j is used to count the 48 coded symbols constituting one codeword.

Thereafter, it is determined in step 1210 whether the first information bit a0 is '1'. If the first information bit a0 is '1', the punctured basis Walsh code W1' (=1011011010011011 0101001001101100101101011011001001) is XORed with the coded symbol sequence parameter code[ ]. Otherwise, if the first information bit a0 is not '1', the control flow skips to step 1212. Specifically, if the information bit a0 is '1', the parameter j is initialized to '0' and a $j^{th}$ symbol of the first punctured Walsh code W1' is XORed with a $j^{th}$ position code[j] of the coded symbol sequence parameter. Here, since j=0, the $0^{th}$ symbol of the first Walsh code is XORed with the $0^{th}$ position of the coded symbol sequence parameter. Further, it is determined whether the parameter j is 47, in order to determine whether the parameter j indicates the last coded symbol. If the parameter j is not equal to 47, the parameter j is increased by 1 and then the above process is repeated. Otherwise, if the parameter j is equal to 47, the control flow proceeds to step 1212. That is, after completion of XORing on the 48 coded symbols, the control flow proceeds to the next step.

After step 1210, it is determined in step 1212 whether the second information bit a1 is '1'. If the second information bit a1 is '1', the punctured basis Walsh code W2' (=01101 101101101100100100100101101100100101101100101101101) is XORed with the coded symbol sequence parameter code[ ] of length 48. Otherwise, if the second information bit a1 is not '1', the control flow skips to step 1214. After step 1212, it is determined in step 1214 whether the third information bit a2 is '1'. If the third information bit a2 is '1', the punctured basis Walsh code W4' (000111000111000111000 111000111000111000111000111) is XORed with the coded symbol sequence parameter code[ ] of length 48. Otherwise, if the third information bit a2 is not '1', the control flow skips to step 1216. After step 1214, it is determined in step 1216 whether the fourth information bit a3 is '1'. If the fourth information bit a3 is '1', the punctured basis Walsh code W8' (=00000011111100000011111100000011111 1000111111) is XORed with the coded symbol sequence parameter code[ ] of length 48. Otherwise, if the fourth information bit a3 is not '1', the control flow skips to step 1218. After step 1216, it is determined in step 1218 whether the fifth information bit a4 is '1'. If the fifth information bit a4 is '1', the punctured basis Walsh code W16' (=000000 0000001111111111110000000000000111111111111) is XORed with the coded symbol sequence parameter code[ ] of length 48. Otherwise, if the fifth information bit a4 is not '1', the control flow skips to step 1220. After step 1218, it is determined in step 1220 whether the sixth information bit a5 is '1'. If the sixth information bit a5 is '1', the punctured basis Walsh code W32' (=000000000000000000000000111 111111111111111111111) is XORed with the coded symbol sequence parameter code[ ] of length 48. Otherwise, if the sixth information bit a5 is not '1', the control flow jumps to step 1222.

After step 1220, it is determined in step 1222 whether the seventh information bit a6 is '1'. If the seventh information bit a6 is '1', a length-48 sequence of all 1's is XORed with the coded symbol sequence parameter code [ ]. Otherwise, if the seventh information bit a6 is not '1', the control flow jumps to step 1224. That is, in step 1222, the symbols of the Walsh code created in the preceding steps are inverted to create a bi-Walsh code corresponding to the Walsh code, thereby to create 128 bi-Walsh codes of length 48.

After step 1222, it is determined in step 1224 whether the eighth information bit a7 is '1'. If the eighth information bit a7 is '1', the basis mask function M1' (=0111011101110100 11000011111010001011101111100001) punctured according to a predetermined puncturing rule is XORed with the coded symbol sequence parameter code[ ] of length 48. Otherwise, if the eighth information bit a7 is not '1', the control flow skips to step 1226. After step 1224, it is determined in step 1226 whether the ninth information bit a8 is '1'. If the ninth information bit a8 is '1', the punctured basis mask function M2' (=100111101001110101011101011 1101001010111001111100) is XORed with the coded symbol sequence parameter code[ ] of length 48. Otherwise, if the ninth information bit a8 is not '1', the control flow skips to step 1228. After step 1226, it is determined in step 1228 whether the tenth information bit a9 is '1'. If the tenth information bit a9 is '1', the punctured basis mask function M4' (=0010001100111011001100101011111110010110011 00110) is XORed with the coded symbol sequence parameter code[ ] of length 48. Otherwise, if the tenth information bit a9 is not '1', the control flow is ended. After the process of FIG. 12, the coded symbols determined by XORing only the sequences corresponding to information bits 1's out of the 10 sequences W1', W2', W4', W8', W16', W32', 1, M1', M2' and M4' of length 32 associated respectively with the 10 input information bits a0–a9 are stored in the parameter code[ ].

The (48,10) encoder creates 1024 codewords by puncturing, for example, $0^{th}$, $4^{th}$, $8^{th}$, $13^{th}$, $16^{th}$, $20^{th}$, $27^{th}$, $31^{st}$, $34^{th}$, $38^{th}$, $41^{st}$, $44^{th}$, $50^{th}$, $54^{th}$, $57^{th}$ and $61^{st}$ symbols from all of the codewords (Walsh codes or mask functions) of length 64 described in the first embodiment. Therefore, the total number of the codewords is 1024. In addition, a (48,9) encoder creates 64 Walsh codes of length 64 determined by puncturing $0^{th}$, $4^{th}$, $8^{th}$, $13^{th}$, $16^{th}$, $20^{th}$, $27^{th}$, $31^{st}$, $34^{th}$, $38^{th}$, $41^{st}$, $44^{th}$, $50^{th}$, $54^{th}$, $57^{th}$ and $61^{st}$ symbols from the 64 Walsh codes of length 64, codes calculated by adding all 1's to (or multiplying −1 by, in case of a real number) symbols of all the punctured Walsh codes among the 1024 codewords, and codes determined by combining a total of 4 mask functions calculated by the combination of a total of 128 codes and 2 mask functions among the 3 punctured mask functions, and a (48,8) encoder creates 64 Walsh codes of length 48, codes calculated by adding all 1's to (or multiplying −1 by, in case of a real number) symbols of every punctured Walsh code among the 1024 codewords, and codes determined by combining a total of 2 mask functions calculated by the combination of a total of 128 codes and 1 mask function among the 3 punctured mask functions. The (48,9) encoder and the (48,8) encoder both have a minimum distance of 18.

The (48,9) encoder can be realized using only two of the 3 mask functions output from the mask function generator of FIG. 7B, while the (48,8) encoder can be realized using only one of the 3 mask functions output from the mask function generator of FIG. 7B. In addition, a (48,7) encoder can be realized using none of the 3 mask functions output from the mask function generator of FIG. 7B. As stated above, the encoder can adaptively perform encoding according to the number of input information bits, and can also have superior performance by increasing the minimum distance determining the performance of the encoder, as high as possible.

Next, a description of a decoder according to the second embodiment of the present invention will be made with reference to FIG. 9.

Referring to FIG. 9, a received signal r(t) corresponding to a TFCI symbol of length 48 having a value of +1/−1 is commonly input to 7 multipliers 901–907. The received signal r(t) is a signal encoded by a given punctured Walsh code and a given punctured mask sequence in the encoder (FIG. 7B) of the transmitter. A mask generator 910 creates every possible mask function which can be created by the 3 basis masks, i.e., mask functions M1'–M7' of length 48 punctured according to a given puncturing rule, and provides the generated mask functions to multipliers 901–907, respectively. The multiplier 901 multiplies the received signal r(t) of length 48 by the mask function M1' output from the mask generator 910, and provides its output to a correlation calculator 921. The multiplier 902 multiplies the received signal r(t) by the mask function M2' output from the mask generator 910, and provides its output to a correlation calculator 922. The multiplier 907 multiplies the received signal r(t) by the mask function M7' output from the mask generator 910, and provides its output to a correlation calculator 927. That is, the multipliers 901–907 multiply the received signal r(t) by their associated mask functions M1'–M7' from the mask generator 910, and provide their outputs to the associated correlation calculators 921–927, respectively. By doing so, the received signal r(t) and the signals calculated by multiplying the received signal r(t) by the possible 7 mask functions, i.e., a total of 8 signals, are provided to the 8 correlation calculators 920–907, respectively. If the transmitter has encoded the TFCI bits using a predetermined mask function, any one of the outputs from the multipliers 901–907 will be a mask function-removed signal. Then, the correlation calculators 920–927 calculate 128 correlation values by correlating the received signal r(t) and the outputs of the multipliers 901–907 with 128 bi-Walsh codes of length 48. The largest one of the calculated correlation values, an index of then-correlated Walsh code and an index of the correlation calculator are provided to a correlation comparator 940. Here, the index of the correlation calculator is equivalent to an index of the mask function indicating which mask function is multiplied by the received signal, for the signal input to the correlation calculator. However, the mask index '0' means that no mask is multiplied by the received signal. The correlation calculator 920 calculates correlation values by correlating the received signal r(t) with 128 biorthogonal codes of length 48. Further, the correlation calculator 920 provides the correlation comparator 940 with the largest one of the calculated correlation values, an index of then correlated Walsh code and an index '0' of the correlation calculator 920. At the same time, the correlation calculator 921 also calculates 128 correlation values by correlating the received signal r(t) multiplied by the mask function M1' by the multiplier 901 with 128 bi-Walsh codes of length 48. Further, the correlation calculator 921 provides the correlation comparator 940 with the largest one of the calculated correlation values, an index of then-calculated Walsh code and an index '1' of the correlation calculator 921. The correlation calculator 922 calculates 128 correlation values by correlating the received signal r(t) multiplied by the mask function M2' by the multiplier 902 with 128 bi-Walsh codes of length 48. Further, the correlation calculator 922 provides the correlation comparator 940 with the largest one of the 128 calculated correlation values, an index of then-calculated Walsh code and an index '2' of the correlation calculator 922. The correlation calculator 927 calculates 128 correlation values by correlating the received signal r(t) multiplied by the mask function M7' by the multiplier 907 with 128 bi-Walsh codes of length 48. Further, the correlation calculator 927 provides the correlation comparator 940 with the largest one of the calculated correlation values, an index of then-calculated Walsh code and an index '7' of the correlation calculator 927.

The correlation comparator 940 then compares the 8 largest correlation values provided from the correlation calculators 920–927, and determines the largest one of them. After determining the largest correlation value, the correlation comparator 940 outputs TFCI information bits transmitted from the transmitter according to the index of the Walsh code provided from the correlation calculator associated with the determined correlation value and an index (or an index of a mask function multiplied by the received signal r(t)) of the same correlation calculator.

The correlation comparator according to the second embodiment has the same operation as that of the correlation comparator according to the first embodiment. An operation of the correlation comparator according to the second embodiment will be described below with reference to FIG. 10.

Referring to FIG. 10, in step 1000, a frequency indicating index i is initialized to 1, and a maximum value, a Walsh code index and a mask index are all initialized to '0'. In step 1010, the correlation value, the Walsh code index for the correlation value and the mask index, output from the first correlation calculator 920, are stored as a first maximum value, a first Walsh code index and a first mask sequence index, respectively. Thereafter, in step 1020, the first maximum value is compared with a previously stored maximum value. If the first maximum value is larger than the previously stored maximum value, the procedure goes to step 1030. Otherwise, if the first maximum value is smaller than or equal to the previously stored maximum value, the procedure proceeds to step 1040. In step 1030, the first maximum value is designated as the maximum value, and the first Walsh code index and the first mask index are designated as the Walsh code index and the mask index, respectively. In step 1040, a count value set for the index parameter i is compared with the number '8' of the correlation calculators, in order to determine whether comparison has been completely performed on all of the 8 correlation values. If the frequency indicating index i is not equal to the number '8' of the correlation calculators in step 1040, the correlation comparator 940 increases the frequency indicating index i by 1 in step 1060 and thereafter, returns to step 1010 to repeat the above-described process using the $i^{th}$ maximum value, the $i^{th}$ Walsh code index and the $i^{th}$ mask index, output from the increased $i^{th}$ correlation calculator. After the above process is repeatedly performed on the $8^{th}$ maximum value, the $8^{th}$ Walsh code index and the $8^{th}$ mask index, the frequency indicating index i becomes 8. Then, the procedure goes to step 1050. In step 1050, the correlation comparator 940 outputs decoded bits (TFCI bits) associated with the Walsh code index and the mask index. The Walsh code index and the mask index corresponding to the decoded bits are the Walsh code index and the mask index corresponding to the largest one of the 8 correlation values provided from the 8 correlation calculators.

As described above, the novel NB-TDD CDMA mobile communication system according to the present invention can efficiently encode and decode the TFCI, so as to increase error correcting capability.

While the invention has been shown and described with reference to a certain preferred embodiment thereof, it will be understood by those skilled in the art that various changes in form and details may be made therein without departing from the spirit and scope of the invention as defined by the appended claims.

The invention claimed is:

1. A method for encoding 10 consecutive input bits indicating a TFCI (Transport Format Combination Indicator) into a sequence of 48 coded symbols in an NB-TDD (Narrowband — Time Division Duplex) mobile communication system, comprising:

generating first sequences having a length 48 punctured orthogonal sequences;
generating second sequences having a length 48 punctured mask sequences;
multiplying the first sequences with each associated TFCI bit and the second sequences with each associated TFCI bit; and
adding each resulting sequences calculated by the multiplication and outputting the sequence of 48 symbols,
wherein the punctured orthogonal sequences and the punctured mask sequences are sequences punctured following positions out of length 64 Walsh codes and length 64 masks; {0, 4, 8,13,16,20,27,31,34,38,41,44, 50,54,57,61}.

2. The method as claimed in claim 1, further comprising step of continuously generating third sequence consisting of same symbols.

3. The method as claimed in claim 1, wherein the basis orthogonal sequences include a $1^{st}$ Walsh code, a $2^{nd}$ Walsh code, a $4^{th}$ Walsh code, an $8^{th}$ Walsh code, a $16^{th}$ Walsh code and a $32^{nd}$ Walsh code, selected from orthogonal sequences of length 64.

4. The method as claimed in claim 1, wherein the basis mask sequences include mask sequences of
0011010101101111101000110000011011110110010100111
001111111000101,
0100011111010001111011010111101101111011000100101
1010001101111000, and
0001100011100111110101001101010010111101101111010
111000110001110.

5. The method as claimed in claim 1, wherein the first sequences are comprised of
1011011010011011010100010011011001101011011001001,
0110110110110110110010010010010110110010010110110,
0001110001110001110001110001110001110001110001110,
0000011111100000001111110000000111111000000111111,
0000000000001111111111110000000000001111111111111,
and
0000000000000000000000001111111111111111111111111.

6. The method as claimed in claim 1, wherein the second sequences are comprised of
1111111111111111111111111111111111111111111111111,
0111011011101001100001111101000101110111100001,
1001110100111010101110101110100101011100111100,
and
0010001100111011001100101011111111101011001100110.

7. An apparatus for encoding 10 consecutive input bits indicating a TFCI(Transport Format Combination Indicator) into a sequence of 48 coded symbols in an NB-TDD (Narrowband-Time Division Duplex) mobile communication system, comprising:

a orthogonal sequence generator for generating first sequences having a length 48 punctured orthogonal sequences;
a mask sequence generator for generating second sequences having a length 48 punctured mask sequences;
a plurality of multipliers being associated with TFCI bits for multiplying the associated TFCI bits by the first sequences or the second sequences; and
an adder for adding output sequences of the multipliers and outputting the sequence of 48 symbols,
wherein the punctured orthogonal sequences and the punctured mask sequences are sequences punctured following positions out of length 64 Walsh codes and length 64 masks;
{0, 4, 8,13,16,20,27,31,34,38,41,44,50,54,57,61}.

8. The apparatus as claimed in claim 7, further comprising step of continuously generating third sequence consisting of same symbols.

9. The apparatus as claimed in claim 7, wherein the basis orthogonal sequences include a $1^{st}$ Walsh code, a $2^{nd}$ Walsh code, a $4^{th}$ Walsh code, an $8^{th}$ Walsh code, a $16^{th}$ Walsh code and a $32^{nd}$ Walsh code, selected from orthogonal sequences of length 64.

10. The apparatus as claimed in claim 7, wherein the basis mask sequences include mask sequences of
0011010101101111101000110000011011110110010100111001111111000101,
0100011111010001111011010111101101111011000100101101000110111000, and
0001100011100111110101001101010010101111011011110101111000110001110.

11. The apparatus as claimed in claim 7, wherein the first sequences are comprised of
1011011010011011010100100110110011010110110010010,
0110110110110110110010010010010110110010010110011,
0001110001110001110001110001110001110001110001111,
0000001111110000001111110000001111110000001111111,
0000000000001111111111110000000000000111111111111,
and
0000000000000000000000001111111111111111111111111.

12. The apparatus as claimed in claim 7, wherein the second sequences are comprised of
1111111111111111111111111111111111111111111111111,
0111011101110100110000111110100010111011111100001,
1001111010011010101110101110100101011100111110,
and
0010001100111011001100101011111111010100100110.

* * * * *